(12) United States Patent
Kang et al.

(10) Patent No.: US 11,222,853 B2
(45) Date of Patent: Jan. 11, 2022

(54) INTEGRATED CIRCUIT CHIP, INTEGRATED CIRCUIT PACKAGE AND DISPLAY APPARATUS INCLUDING THE INTEGRATED CIRCUIT CHIP

(71) Applicant: Samsung Electronics Co., Ltd., Suwon-si (KR)

(72) Inventors: Jun-gu Kang, Hwaseong-si (KR); Young-mok Kim, Yongin-si (KR); Woon-bae Kim, Seoul (KR); Dae-cheol Seong, Seoul (KR); Yune-seok Chung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/589,589

(22) Filed: Oct. 1, 2019

(65) Prior Publication Data

US 2020/0227359 A1 Jul. 16, 2020

(30) Foreign Application Priority Data

Jan. 10, 2019 (KR) .......................... 10-2019-0003284

(51) Int. Cl.
*H01L 23/552* (2006.01)
*H01L 23/48* (2006.01)
(Continued)

(52) U.S. Cl.
CPC .......... *H01L 23/552* (2013.01); *H01L 21/743* (2013.01); *H01L 23/481* (2013.01); *H01L 24/05* (2013.01); *H01L 24/06* (2013.01); *H01L 24/14* (2013.01); *H01L 27/1203* (2013.01); *H01L 2224/0401* (2013.01); (Continued)

(58) Field of Classification Search
CPC ............. H01L 21/743; H01L 21/76898; H01L 2224/0401; H01L 2224/0557; H01L 2224/09103; H01L 2224/1403; H01L 23/481; H01L 23/5225; H01L 23/552;
(Continued)

(56) References Cited

U.S. PATENT DOCUMENTS 6,121,659 A * 9/2000 Christensen ............ H01L 21/84
257/347
6,358,782 B1 * 3/2002 Masuda ................ H01L 21/743
257/E21.538

(Continued)

*Primary Examiner* — Mohammed Shamsuzzaman
(74) *Attorney, Agent, or Firm* — Harness, Dickey & Pierce, P.L.C.

(57) ABSTRACT

An integrated circuit chip includes an SOI substrate having a structure in which a bulk substrate, a buried insulating film, and a semiconductor body layer are sequentially stacked, a conductive ion implantation region formed at a position adjacent to the buried insulating film in the bulk substrate, an integrated circuit portion formed on an active surface of the semiconductor body layer, and a penetrating electrode portion arranged at a position spaced apart from the integrated circuit portion in a horizontal direction, the penetrating electrode portion penetrating the semiconductor body layer and the buried insulating layer in a vertical direction, and the penetrating electrode portion connected to the conductive ion implantation region. An integrated circuit package and a display device include the integrated circuit chip.

12 Claims, 21 Drawing Sheets

(51) Int. Cl.
*H01L 23/00* (2006.01)
*H01L 21/74* (2006.01)
*H01L 27/12* (2006.01)

(52) U.S. Cl.
CPC .............. *H01L 2224/0557* (2013.01); *H01L 2224/09103* (2013.01); *H01L 2224/1403* (2013.01)

(58) Field of Classification Search
CPC ......... H01L 24/05; H01L 24/06; H01L 24/14; H01L 27/1203; H01L 2924/3025
See application file for complete search history.

(56) References Cited

U.S. PATENT DOCUMENTS

| | | |
|---|---|---|
| 9,087,719 B2 | 7/2015 | Ahsan et al. |
| 9,117,819 B2 | 8/2015 | Gan |
| 9,165,943 B2 | 10/2015 | Fenouillet-Beranger et al. |
| 9,299,640 B2 * | 3/2016 | Lin .................. H01L 25/50 |
| 9,401,355 B2 | 7/2016 | Weyers et al. |
| 9,607,978 B2 | 3/2017 | Deval et al. |
| 9,666,577 B2 | 5/2017 | Solaro et al. |
| 9,748,361 B2 | 8/2017 | Sheu et al. |
| 2008/0247101 A1 * | 10/2008 | Salman ............... H01L 27/1203 361/56 |
| 2009/0001466 A1 * | 1/2009 | Yang .................... H01L 21/743 257/347 |
| 2010/0178761 A1 * | 7/2010 | Chen ................. H01L 23/49816 438/613 |
| 2017/0005081 A1 | 1/2017 | Laine et al. |
| 2021/0066378 A1 * | 3/2021 | Tsai ................... H01L 27/1469 |

* cited by examiner

B - B'

INTEGRATED CIRCUIT CHIP, INTEGRATED CIRCUIT PACKAGE AND DISPLAY APPARATUS INCLUDING THE INTEGRATED CIRCUIT CHIP

CROSS-REFERENCE TO RELATED APPLICATION

This application claims the benefit of Korean Patent Application No. 10-2019-0003284, filed on Jan. 10, 2019, in the Korean Intellectual Property Office, the disclosure of which is incorporated herein in its entirety by reference.

BACKGROUND

The inventive concepts relates to an integrated circuit chip, an integrated circuit package and/or a display apparatus including the integrated circuit chip, and more particularly, to an integrated circuit chip having an electromagnetic shielding structure, and an integrated circuit package and/or a display apparatus including the integrated circuit chip.

In accordance with the increase in a frame rate of a frame to be displayed on a display apparatus, the increase in resolution of the display apparatus, the increase in a three-dimensional image displayed on the display apparatus, and the like, the power consumption of a driver in the integrated circuit chip for driving a data line of the display apparatus is increased and the peak of current is increased, thereby being capable of increasing electromagnetic interference (EMI) generated in the integrated circuit chip.

SUMMARY

Some of the inventive concepts provide an integrated circuit chip having a structure capable of increasing or ensuring a tolerance against EMI while reducing the increase of an area due to a structure for shielding EMI.

Some of the inventive concepts provide an integrated circuit package and/or a display apparatus including an integrated circuit chip capable of increasing or ensuring the tolerance against EMI while reducing the increase of an area due to a structure for shielding EMI.

According to an aspect of the inventive concepts, there is provided an integrated circuit chip including: a semiconductor on insulator (SOI) substrate having a structure in which a bulk substrate, a buried insulating film, and a semiconductor body layer are sequentially stacked; a conductive ion implantation region formed at a position adjacent to the buried insulating film in the bulk substrate, an integrated circuit portion formed on an active surface of the semiconductor body layer; and a penetrating electrode portion arranged at a position spaced apart from the integrated circuit portion in a horizontal direction, the penetrating electrode portion penetrating the semiconductor body layer and the buried insulating layer in a vertical direction, and the penetrating electrode portion connected to the conductive ion implantation region.

According to another aspect of the inventive concepts, there is provided an integrated chip including: an SOI substrate including a semiconductor body layer having an active surface, a buried insulating film contacting with an opposite surface of the active surface of the semiconductor body layer, and a bulk substrate facing the semiconductor body layer with the buried insulating film therebetween; a conductive ion implantation region formed in the bulk substrate at a position adjacent to the buried insulating film; a front-end-of-line (FEOL) structure including an integrated circuit portion formed on the active surface of the semiconductor body layer; and a penetrating electrode portion penetrating the FEOL structure, the semiconductor body layer, and the buried insulating film in a vertical direction, and the penetrating electrode portion having a first end contacting with the conductive ion implantation region.

According to another aspect of the inventive concepts, there is provided an integrated chip including: an SOI substrate having a structure in which a bulk substrate, a buried insulating film, and a semiconductor body layer are sequentially stacked; at least one conductive ion implantation region formed at a position adjacent to the buried insulating film in the bulk substrate; an FEOL structure formed on the SOI substrate and including an integrated circuit portion formed on an active surface of the semiconductor body layer; an electromagnetic shielding structure including at least one penetrating electrode portion having a first end vertically penetrating the FEOL structure, the semiconductor body layer, and the buried insulating layer and connected to the at least one conductive ion implantation region, and the at least one penetrating electrode portion having a second end protruding from the semiconductor body layer vertically farther than an upper surface of the FEOL structure; and at least one connection terminal configured to be electrically connected to the second end of the at least one penetrating electrode portion.

According to another aspect of the inventive concepts, there is provided an integrated circuit package including: a support substrate; a plurality of interconnections formed on the support substrate; an integrated circuit chip mounted on the support substrate and configured to be electrically connected to the plurality of interconnections, wherein the integrated circuit chip may be comprised of any one of the integrated circuit chips according to embodiments of the inventive concepts. According to an aspect of the inventive concepts, there is provided a display apparatus including: a display driver IC (DDI) chip being comprised of any one of the integrated circuit chips according to embodiments of the inventive concepts, and a display panel configured to display the display data under the control of the DDI chip.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1A:
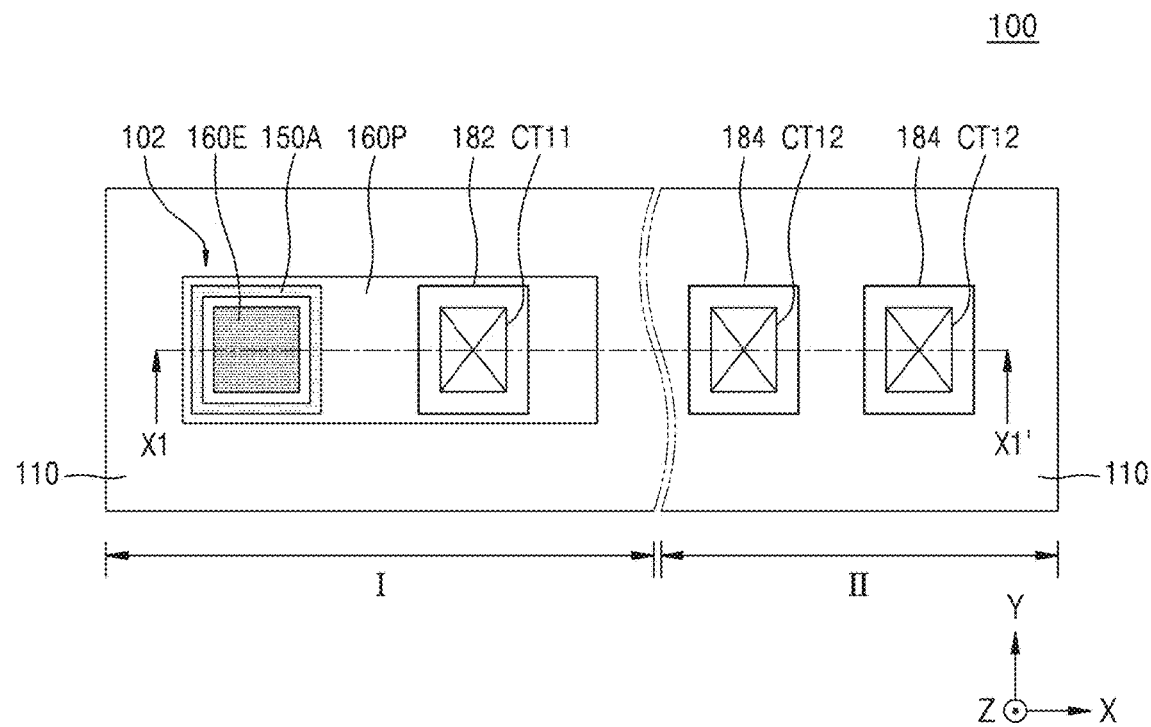
FIG. 1A is a plan view of a portion of an integrated circuit chip according to some embodiments of the inventive concepts.

Hereinafter, embodiments of the inventive concepts will be described in detail with reference to the accompanying drawings. The same reference numerals are used for the same elements in the drawings, and a duplicate description thereof will be omitted.

Figure 1B:
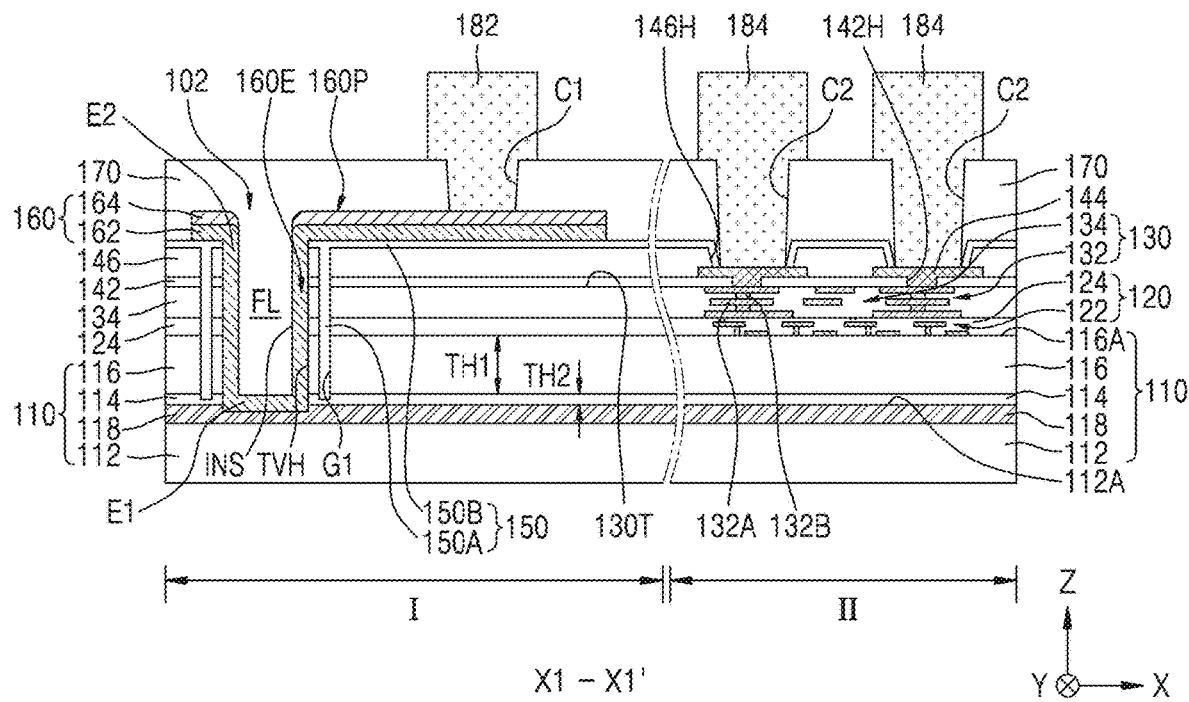
FIG. 1B is a sectional view taken along the line X1-X1' in FIG. 1A.

FIG. 1A is a plan view of a portion of an integrated circuit chip 100 according to some embodiments of the inventive concepts, and FIG. 1B is a sectional view taken along the line X1-X1' in FIG. 1A.

Referring to FIGS. 1A and 1B, the integrated circuit chip 100 may include an SOI substrate 110 having a structure in which a bulk substrate 112, a buried insulating film 114, and a semiconductor body layer 116 are sequentially stacked. The integrated circuit chip 100 may include an electromagnetic shielding contact region I and an integrated circuit device region II, and the SOI substrate 110 may extend across the electromagnetic shielding contact region I and the integrated circuit device region II.

The bulk substrate 112 and the semiconductor body layer 116 may include a semiconductor layer, for example, a silicon (Si) layer, and the buried insulating film 114 may include a silicon oxide film.

The bulk substrate 112 may include a conductive ion implantation region 118. The conductive ion implantation region 118 may be formed at a position adjacent to the buried insulating film 114 in the bulk substrate 112. The bulk substrate 112 may have a first surface 112A that is in contact with the buried insulating film 114. The conductive ion implantation region 118 may be formed entirely on the first surface 112A of the bulk substrate 112 in the electromagnetic shielding contact region I and the integrated circuit device region II, and may extend from the first surface 112A into an interior of the bulk substrate 112 with a certain thickness. The conductive ion implantation region 118 may include a P++ type ion implantation region or an N++ type ion implantation region. For example, the conductive ion implantation region 118 may be an ion implantation region doped with boron B.

The semiconductor body layer 116 may have an active surface 116A. The buried insulating film 114 may be in contact with the opposite surface to the active surface 116A of the semiconductor body layer 116. The bulk substrate 112 may face the semiconductor body layer 116 with the buried insulating film 114 therebetween.

In the SOI substrate 110, a thickness TH1 of the semiconductor body layer 116 may be greater than a thickness TH2 of the buried insulating film 114. For example, the thickness TH1 of the semiconductor body layer 116 may be about 5 μm to about 10 μm, and the thickness TH2 of the buried insulating film 114 may be about 50 Å to about 200 Å. A thickness of the bulk substrate 112 may be about 5 μm to about 10 μm.

The electromagnetic shielding contact region I may include an electromagnetic shielding structure 102 that provides a conductive path for electromagnetic shielding. The integrated circuit device region II may include various circuits and various interconnection structures constituting the integrated circuit chip 100.

The integrated circuit chip 100 may include a front-end-of-line (FEOL) structure 120 formed on the SOI substrate 110. The FEOL structure 120 may include an integrated circuit portion 122 including various circuits and various interconnection structures formed on the active surface 116A of the semiconductor body layer 116 in the integrated circuit device region II, and an interlayer insulating film 124 for mutually insulating individual devices constituting the integrated circuit portion 122. The integrated circuit portion 122 may formed only in the integrated circuit device region II from among the electromagnetic shielding contact region I and the integrated circuit element region II, and the interlayer insulating film 124 may formed to cover the semiconductor body layer 116 both in the electromagnetic shielding contact region I and the integrated circuit device region II, respectively.

The integrated circuit portion 122 may include a plurality of individual devices of various kinds. The integrated circuit portion 122 may include a variety of microelectronic devices, such as a metal-oxide-semiconductor field effect transistor (MOSFET), a system large scale integration (LSI), a micro-electro-mechanical system (MEMS), an active device, or a passive device. Some of the plurality of individual devices constituting the integrated circuit portion 122 may be configured to be electrically connected to a conductive region of the semiconductor body layer 116, for example, to a well made of an ion implantation region. Each of the plurality of individual devices may be electrically separated from other individual devices adjacent thereto by the interlayer insulating film 124.

On the FEOL structure 120, a back-end-of-line (BEOL) structure 130 may be formed. The BEOL structure 130 may include a plurality of multilayer interconnection structures 132 and an intermetal insulating film 134. The plurality of multilayer interconnection structures 132 may each include a plurality of interconnection layers 132A and a plurality of contact plugs 132B interconnecting the plurality of interconnection layers 132A to each other therebetween. The plurality of multilayer interconnection structures 132 may be formed only in the integrated circuit device region II from among the electromagnetic shielding contact region I and the integrated circuit device region II, and the intermetal insulating film 134 may be formed to cover the FEOL structure 120 both in the electromagnetic shielding contact region I and the integrated circuit device region II.

The plurality of interconnection layers 132A and the plurality of contact plugs 132B constituting the plurality of multilayer interconnection structures 132 may each include a metal layer and a conductive barrier film surrounding the surface of the metal layer. The metal layer may include Cu, W, Ta, Ti, Co, Mn, Al, or a combination thereof, and the conductive barrier layer may include Ta, Ti, TaN, TiN, AlN, WN, or a combination thereof. The plurality of multilayer interconnection structures 132 may each include the plurality of interconnection layers 132A sequentially stacked in a vertical direction (a Z direction). The number of stacked layers of the plurality of interconnection layers 132A may not be particularly limited and may be variously selected. The plurality of multilayer interconnection structures 132 may be insulated from each other by the intermetal insulating film 134. The intermetal insulating film 134 may include a silicon oxide film, a silicon nitride film, a silicon oxynitride film, or a combination thereof.

The BEOL structure 130 may be covered with a first passivation film 142 in the electromagnetic shielding contact region I and the integrated circuit device region II. A plurality of contact pads 144 may be formed on the first passivation film 142 in the integrated circuit device region II. The plurality of contact pads 144 may be connected to the plurality of multilayer interconnection structures 132 through a plurality of first contact holes 142H formed in the first passivation film 142. The plurality of contact pads 144 may each include a metal layer and a conductive barrier film surrounding the surface of the metal layer. For example, the metal layer may include Al. The conductive barrier film may include Ti, TiN, or a combination thereof. The first passivation film 142 and the plurality of contact pads 144 may be covered with a second passivation film 146. A plurality of second contact holes 146H may be formed in the second passivation film 146 in the integrated circuit device region II. Each of the first passivation film 142 and the second passivation film 146 may include an oxide film, a nitride film, or a combination thereof, but are not limited thereto.

An electromagnetic shielding structure 102 may include a penetrating electrode portion 160E and a grounding pad portion 160P integrally connected to each other. The penetrating electrode portion 160E may be formed to be extended at length in the vertical direction (the Z direction) in a through-via hole (TVH) passing through the buried insulating film 114, the semiconductor body layer 116, the interlayer insulating film 124 of the FEOL structure 120, the intermetal insulating film 134 of the BEOL structure 130, the first passivation film 142, and the second passivation film 146 in the electromagnetic shielding contact region I. The ground pad portion 160P may extend in a horizontal direction over the second passivation film 146.

The penetrating electrode portion 160E may have an island-shaped planar structure. The penetrating electrode portion 160E may include a first end E1 and a second end E2 which are opposite to each other in the vertical direction (the Z direction). The first end E1 of the penetrating electrode portion 160E may be in contact with the conductive ion implantation region 118. The second end E2 of the penetrating electrode portion 160E may be integrally connected to the ground pad portion 160P. A vertical distance from the active surface 116A of the semiconductor body layer 116 to the second end E2 may be greater than a vertical distance from the active surface 116A of the semiconductor body layer 116 to a top surface 130T of the BEOL structure 130. Therefore, the second end E2 of the penetrating electrode portion 160E may protrude from the semiconductor body layer 116 in the vertical direction further than an upper surface of the top surface 130T of the BEOL structure 130. A vertical distance from the semiconductor body layer 116 to the ground pad portion 160P may be greater than a vertical distance from the semiconductor body layer 116 to any one of the plurality of contact pads 144.

A groove G1 surrounding at least a portion of the penetrating electrode portion 160E at a position spaced apart from the penetrating electrode portion 160E in the horizontal direction (for example, an X direction and a Y direction) may be formed in the electromagnetic shielding contact region I. The groove G1 may include a ring-shaped space extending in the vertical direction (the Z direction) through the buried insulating film 114, the semiconductor body layer 116, the interlayer insulating film 124 of the FEOL structure 120, the intermetal insulating film 134 of the BEOL structure 130, the first passivation film 142, and the second passivation film 146. A surface of the second passivation film 146 may be covered with an insulating film 150. The insulating film 150 may include a penetrating insulating portion 150A filling the groove G1 and an insulating liner portion 150B covering an upper surface of the second passivation film 146. The penetrating insulating portion 150A may surround at least a portion of the penetrating electrode portion 160E at a position spaced horizontally from the penetrating electrode portion 160E. The ground pad portion 160P of the electromagnetic shielding structure 102 may be spaced apart from the second passivation film 146 with the insulating liner portion 150B therebetween. The insulating film 150 may include an aluminum oxide film or a hafnium oxide film. In some embodiments, at least a portion of the penetrating insulating portion 150A may include an air gap. As used herein, the term "air" may refer to the atmosphere or other gases that may be present in the manufacturing process. The penetrating insulating portion 150A may have a ring-shaped planar structure extending in the vertical direction (the Z direction) through the buried insulating film 114, the semiconductor body layer 116, the interlayer insulating film 124 of the FEOL structure 120, the intermetal insulating film 134 of the BEOL structure 130, the first passivation film 142 and the second passivation film 146.

The penetrating electrode portion 160E and the ground pad portion 160P may include a conductive layer 160. The conductive layer 160 may have a multilayer structure including a plurality of metals and/or conductive metal nitrides. In some embodiments, a thickness of the ground pad portion 160P of the conductive layer 160 may be greater than a thickness of the penetrating electrode portion 160E. The conductive layer 160 may include a first conductive layer 162 that conformally covers a bottom surface and a sidewall of the through-via hole TVH and an upper surface of the insulating liner portion 150B, and a second conductive layer 164 covering the first conductive layer 162 over the upper surface of the insulating liner portion 150B. The first conductive layer 162 may be in direct contact with the conductive ion implantation region 118. In some embodiments, the second conductive layer 164 may not be formed inside the through-via hole TVH, but may cover the first conductive layer 162 outside the through-via hole TVH. In some embodiments, the second conductive layer 164 may be formed to include a portion covering the first conductive layer 162 inside the through-via hole TVH. In some embodiments, the conductive layer 160 may include W, Al, Ti, TiN, or a combination thereof. For example, the first conductive layer 162 may include a combination of a conductive barrier film made of Ti, TiN, or a combination thereof and a W film, and the second conductive layer 164 may include a combination of a conductive barrier film made of Ti, TiN, or a combination thereof and an Al film.

The penetrating electrode portion 160E may roughly have a U-shaped cross-sectional shape extending in the vertical direction (the Z direction) to define an inner insulating space INS inside the through-via hole TVH passing through the insulating liner portion 150B of the insulating film 150, the second passivation film 146, the first passivation film 142, the intermetal insulating film 134, the interlayer insulating film 124, the semiconductor body layer 116 and the buried insulating film 114. The penetrating electrode portion 160E may be in contact with the insulating liner portion 150B, the second passivation film 146, the first passivation film 142, the intermetal insulating film 134, the interlayer insulating film 124, the semiconductor body layer 116, the buried insulating film 114, and the conductive ion implantation region 118.

The penetrating electrode portion 160E, the ground pad portion 160P, and the insulating film 150 may be covered with a third passivation film 170. The inner insulating space INS may be filled with a filling insulating film FL. In one example embodiment, the filling insulating film FL may be a portion of the third passivation film 170. In some embodiments, the filling insulating film FL may be a separate film different from the third passivation film 170, and the third passivation film 170 may cover the filling insulating film FL and the electromagnetic shielding structure 102. The filling insulating film FL may include an oxide film, a nitride film, an air gap, or a combination thereof. The third passivation film 170 may include an oxide film, a nitride film, or a combination thereof.

The integrated circuit chip 100 may include a first connection terminal 182 and a plurality of second connection terminals 184 formed on the third passivation film 170. The first connection terminal 182 may be connected to the ground pad portion 160P through a first contact hole C1 formed in the third passivation film 170 in the electromagnetic shielding contact region I. Each of the plurality of second connection terminals 184 may be connected to the contact pad 144 through a second contact hole C2 formed in the third passivation film 170 in the integrated circuit device region II. In FIG. 1A, "CT11" may represent a contact area between the ground pad portion 160P and the first connection terminal 182, and "CT12" may represent a contact area between the contact pad 144 and the second connection terminal 184.

A vertical length of the first connection terminal 182 may be less than a vertical length of each of the plurality of second connection terminals 184. In some embodiments, the first connection terminal 182 and the plurality of second connection terminals 184 may include a gold (Au) bump.

Figure 2A:
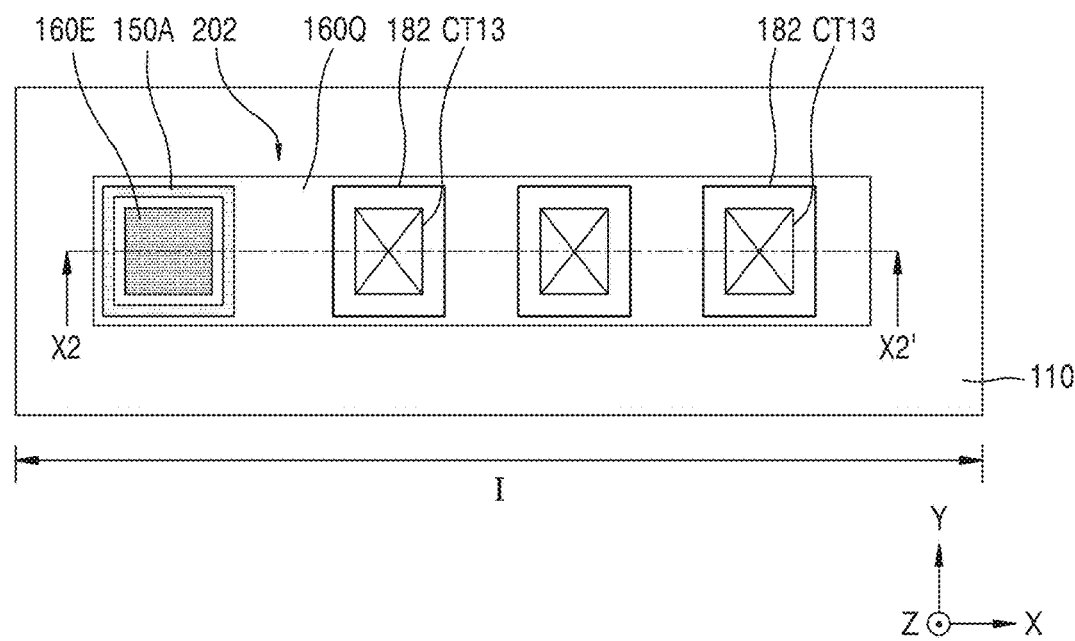
FIG. 2A is a plan view of a portion of an integrated circuit chip according to some embodiments of the inventive concepts.
Figure 2B:
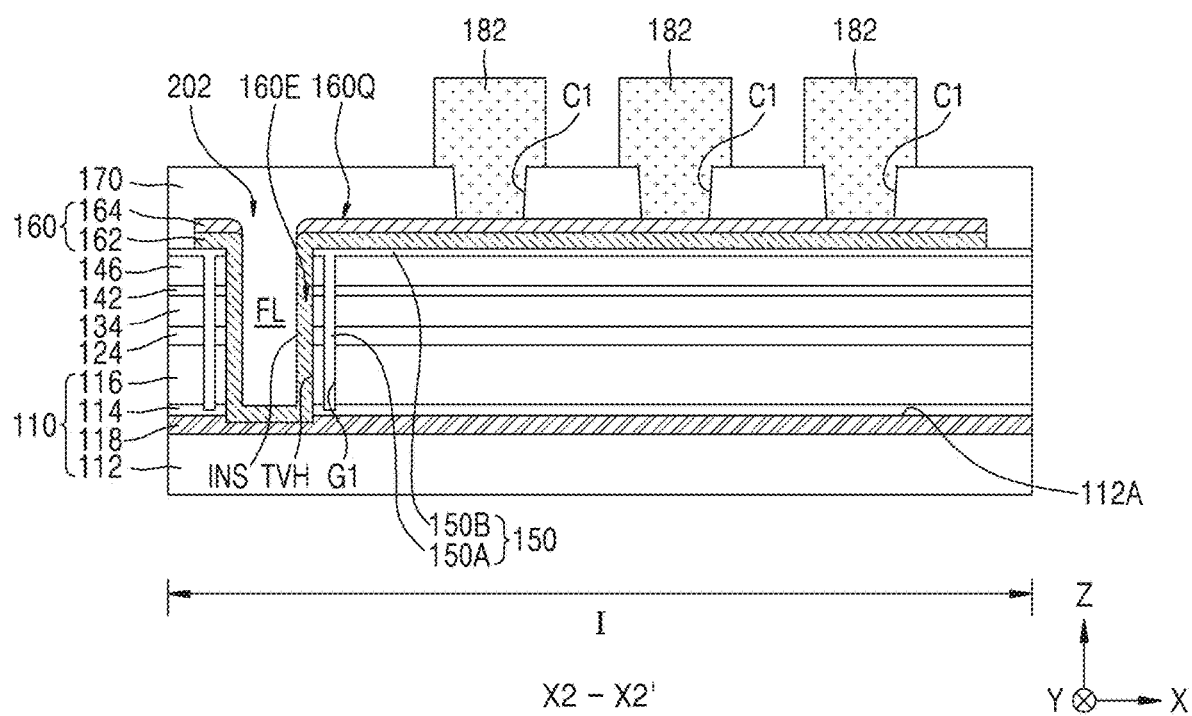
FIG. 2B is a cross-sectional view taken along the line X2-X2' in FIG. 2A.

FIG. 2A is a plan view of a portion of an integrated circuit chip 200 according to some embodiments of the inventive concepts, and FIG. 2B is a cross-sectional view taken along the line X2-X2' in FIG. 2A.

Referring to FIGS. 2A and 2B, the integrated circuit chip 200 may have generally the same configuration as the integrated circuit chip 100 illustrated in FIGS. 1A and 1B. Although only the electromagnetic shielding contact region I is shown in FIGS. 2A and 2B, the integrated circuit chip 200 may further include the integrated circuit device region II illustrated in FIGS. 1A and 1B.

The integrated circuit chip 200 may include an electromagnetic shielding structure 202 formed in the electromagnetic shielding contact region I and providing a conductive path for electromagnetic shielding. The electromagnetic shielding structure 202 may have generally the same configuration as the electromagnetic shielding structure 102 described with reference to FIGS. 1A and 1B. However, the electromagnetic shielding structure 202 may include a ground pad portion 160Q. The ground pad portion 160Q may be integrally connected to the penetrating electrode portion 160E and may extend in the horizontal direction over the second passivation film 146. A plurality of first connection terminals 182 spaced apart from each other may be connected to the ground pad portion 160Q. The plurality of first connection terminals 182 may be connected to the ground pad portion 160Q through a plurality of first contact holes C1 formed in the third passivation film 170. In FIG. 2A, "CT13" may represent a contact area between the ground pad portion 160Q and the first connection terminal 182.

Figure 3:
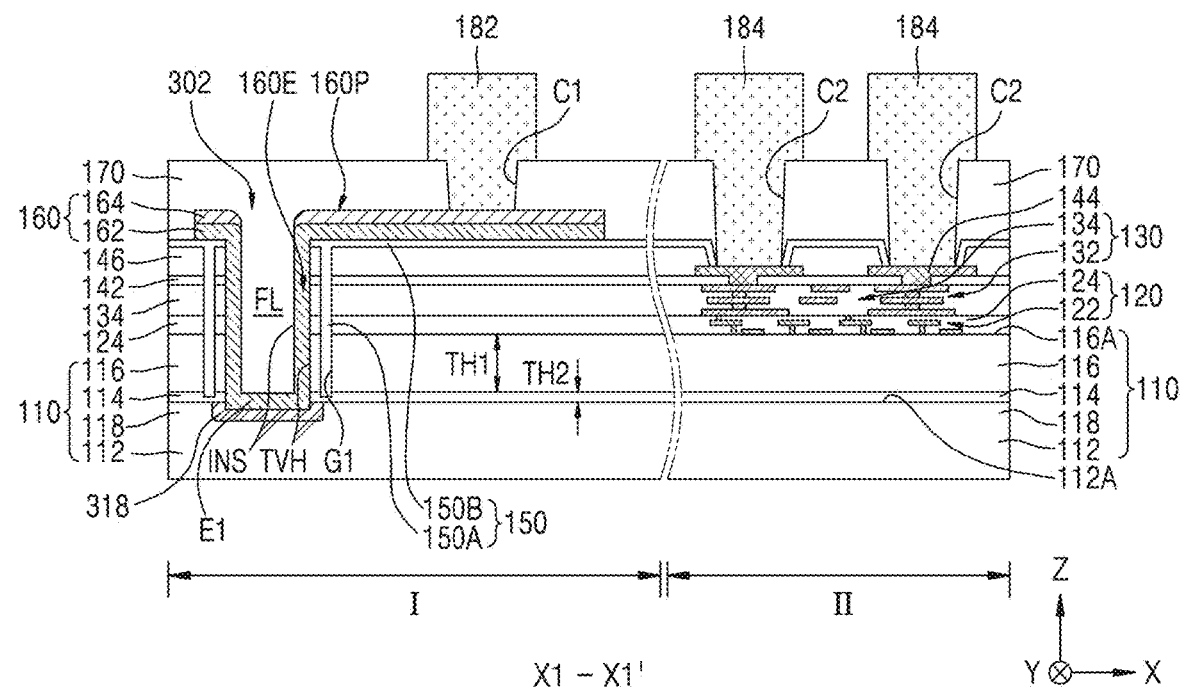
FIG. 3 is a cross-sectional view of a portion of an integrated circuit chip according to some embodiments of the inventive concepts.

FIG. 3 is a cross-sectional view of a portion of an integrated circuit chip 300 according to some embodiments of the inventive concepts.

Referring to FIG. 3, the integrated circuit chip 300 may have generally the same configuration as the integrated circuit chip 100 illustrated in FIGS. 1A and 1B. However, the integrated circuit chip 300 may include a conductive ion implantation region 318 instead of the conductive ion implantation region 118 illustrated in FIG. 1B. The integrated circuit chip 300 may include an electromagnetic shielding structure 302 that may provide a conductive path for electromagnetic shielding in the electromagnetic shield contact region I. The electromagnetic shielding structure 302 may have generally the same configuration as the electromagnetic shielding structure 102 illustrated in FIGS. 1A and 1B. However, the first end E1 of the penetrating electrode portion 160E in the electromagnetic shielding structure 302 may be in contact with the conductive ion implantation region 318.

The conductive ion implantation region 318 may be locally formed around the penetrating electrode portion 160E in the first surface 112A contacting with the penetrating electrode portion 160E and the buried insulating film 114 in the bulk substrate 112, and the first end E1 of the penetrating electrode portion 160E may be surrounded by the conductive ion implantation region 318. The conductive ion implantation region 318 may not be formed in a region of the bulk substrate 112 that vertically overlaps with the integrated circuit portion 122, but may be formed in a region of the bulk substrate 112 that does not vertically overlap with the integrated circuit portion 122. The conductive ion implantation region 318 may be formed only in the electromagnetic shielding contact region I and may not be formed in the integrated circuit device region II of the bulk substrate 112. The conductive ion implantation region 318 may include a P++ type ion implantation region or an N++ type ion implantation region. For example, the conductive ion implantation region 318 may include an ion implantation region doped with boron (B).

Figure 4A:
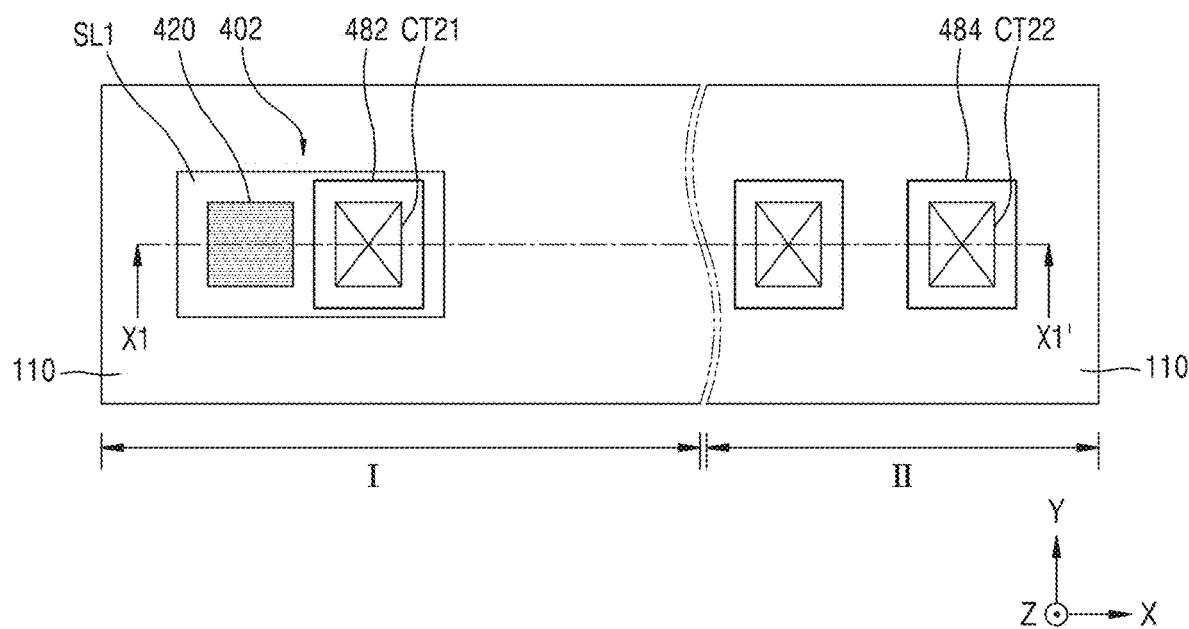
FIG. 4A is a plan view of a portion of an integrated circuit chip according to some embodiments of the inventive concepts.
Figure 4B:
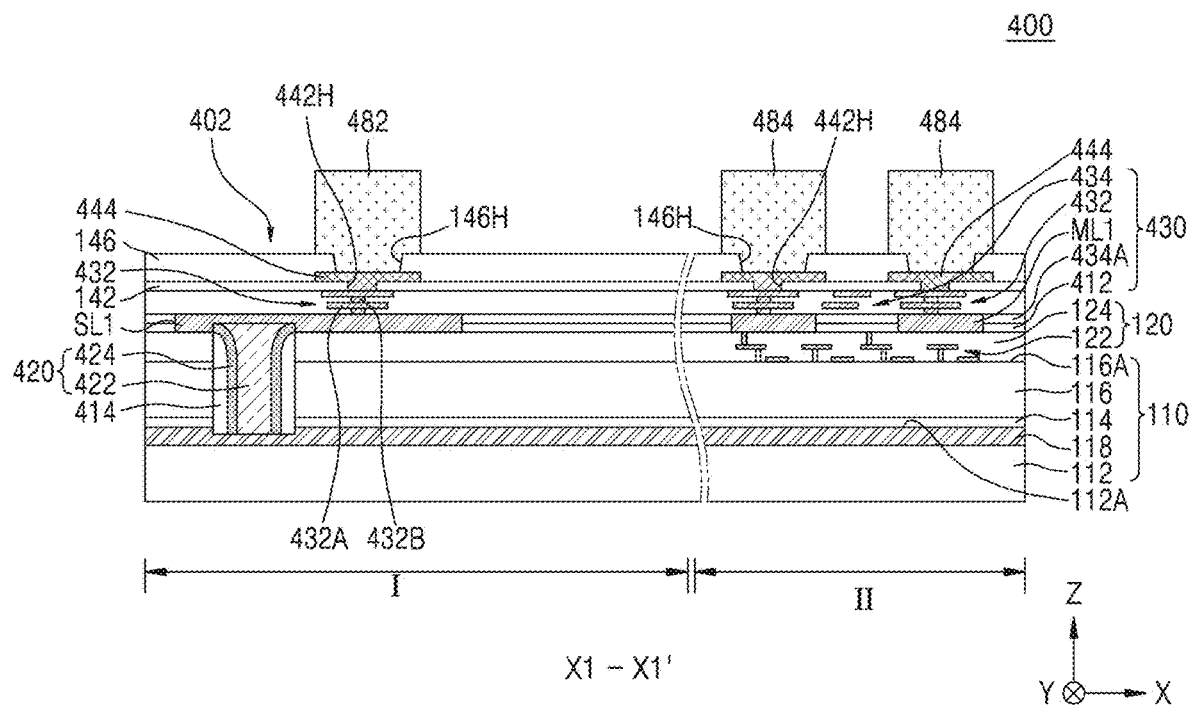
FIG. 4B is a cross-sectional view taken along line X1-X1' of FIG. 4A.

FIG. 4A is a plan view of a portion of an integrated circuit chip 400 according to some embodiments of the inventive concepts, and FIG. 4B is a cross-sectional view taken along line X1-X1' of FIG. 4A.

Referring to FIGS. 4A and 4B, the integrated circuit chip 400 may have generally the same configuration as the integrated circuit chip 100 illustrated in FIGS. 1A and 1B. However, the BEOL structure 430 of the integrated circuit chip 400 may include a plurality of multilayer interconnection structures 432 located in the electromagnetic shielding contact region I and the integrated circuit device region II, and may also include an intermetal insulating film 434 for insulating each of the plurality of multilayer interconnection structures 432 from each other.

The integrated circuit chip 400 may include an electromagnetic shielding structure 402 formed in the electromagnetic shielding contact region I. The electromagnetic shielding structure 402 may include a penetrating electrode portion 420, the multilayer interconnection structure 432 of the BEOL structure 430 located in the electromagnetic shielding contact region I and connected to the penetrating electrode portion 420, and a contact pad 444 arranged between a first connection terminal 482 and the multilayer interconnection structure 432 electrically connected to the penetrating electrode portion 420 in the electromagnetic shielding contact region I and interconnects the first connection terminal 482 and the multilayer interconnection structure 432.

The penetrating electrode portion 420 may extend in the vertical direction (the Z direction) passing through the buried insulating film 114, the semiconductor body layer 116, and the interlayer insulating film 124 of the FEOL structure 120 in the electromagnetic shielding contact region I. The penetrating electrode portion 420 may include a metal plug 422 and a conductive barrier film 424 covering a surface of the metal plug 422. A bottom surface of the penetrating electrode portion 420 may be in contact with the conductive ion implantation region 118. The metal plug 422 may include Cu. The conductive barrier film 424 may include Ti, TiN, or a combination thereof. The penetrating electrode portion 420 may be surrounded by a via insulating film 414. The via insulating film 414 may be in contact with an outer sidewall of the penetrating electrode portion 420. The via insulating film 414 may include a silicon oxide film.

In the BEOL structure 430, the plurality of multilayer interconnection structures 432 may include a plurality of interconnection layers 432A and a plurality of contact plugs 432B interconnecting the interconnection layers 432A therebetween. The constituent materials of the plurality of interconnection layers 432A, the plurality of contact plugs 432B, and the intermetal insulating film 434 may be generally the same as that of the plurality of interconnection layers 132A, the plurality of contact plugs 132B, and the intermetal insulating film 134, referring to FIGS. 1A and 1B.

The plurality of multilayer interconnection structures 432 may include a first level shielding interconnection line SL1 located in the electromagnetic shielding contact region I and in contact with the penetrating electrode portion 420. The first level shielding interconnection line SL1 may be arranged at the same level as a plurality of first level interconnection lines ML1 closest to the FEOL structure 120 among the plurality of multilayer interconnection structures 432 located in the integrated circuit device region II. The intermetal insulating film 434 may include a polishing stopper film 412 and a first level insulating film 434A sequentially stacked on the FEOL structure 120 for insulating the first level shielding interconnection line SL1 and each of the plurality of first level interconnection lines ML1 from each other. The polishing stopper film 412 may include a silicon nitride film or a silicon oxynitride film. The first level insulating film 434A may include a single film or a multiple film selected from a silicon nitride film, a silicon oxide film, a silicon carbide nitride film, or a combination thereof.

FIG. 4B illustrates a structure in which the first level shielding line SL1 is in contact with a top surface of the penetrating electrode portion 420, but the inventive concepts are not limited thereto. For example, the penetrating electrode portion 420 may be in contact with an interconnection of a last level farthest from the FEOL structure 120 among the plurality of multilayer interconnection structures 432, or may contact an interconnection of an arbitrary level between the first level shielding interconnection line SL1 and the interconnection of the last level. A vertical length of the penetrating electrode portion 420 may vary depending on the level of the interconnection contacting with the penetrating electrode portion 420.

In the electromagnetic shielding contact region I and the integrated circuit device region II, the BEOL structure 430 may be covered with the first passivation film 142. The plurality of contact pads 444 may be connected to the plurality of multilayer interconnection structures 432 through a plurality of first contact holes 442H formed in the first passivation film 142 in the electromagnetic shielding contact region I and the integrated circuit device region II. The plurality of contact pads 444 may each include a metal layer and a conductive barrier film surrounding the surface of the metal layer. The plurality of contact pads 444 may have generally the same configuration as that described for the plurality of contact pads 144 with reference to FIGS. 1A and 1B.

The first passivation film 142 and the plurality of contact pads 444 may be covered with the second passivation film 146 in the electromagnetic shielding contact region I and the integrated circuit device region II. The second passivation film 146 may be formed with a plurality of second contact holes 146H located in the electromagnetic shielding contact region I and the integrated circuit device region II.

The integrated circuit chip 400 may include a first connection terminal 482 and a plurality of second connection terminals 484 formed on the second passivation film 146. The first connection terminal 482 may be connected to the multilayer interconnection structure 432 through the second contact hole 146H formed in the second passivation film 146 in the electromagnetic shielding contact region I. The plurality of second connection terminals 484 may be connected to the plurality of multilayer interconnection structures 432 through the plurality of second contact holes 146H formed in the second passivation film 146 in the integrated circuit device region II. In FIG. 4A, "CT21" represents a contact area between the contact pad 444 and the first connection terminal 482 in the electromagnetic shielding contact region I, and "CT22" represents a contact area between the contact pad 444 and the second connection terminal 484 in the integrated circuit device region II.

A vertical length of the first connection terminal 482 may be approximately the same as or similar to a vertical length of each of the plurality of second connection terminals 484. In some embodiments, the first connection terminal 482 and the plurality of second connection terminals 484 may include a gold (Au) bump.

Figure 5:
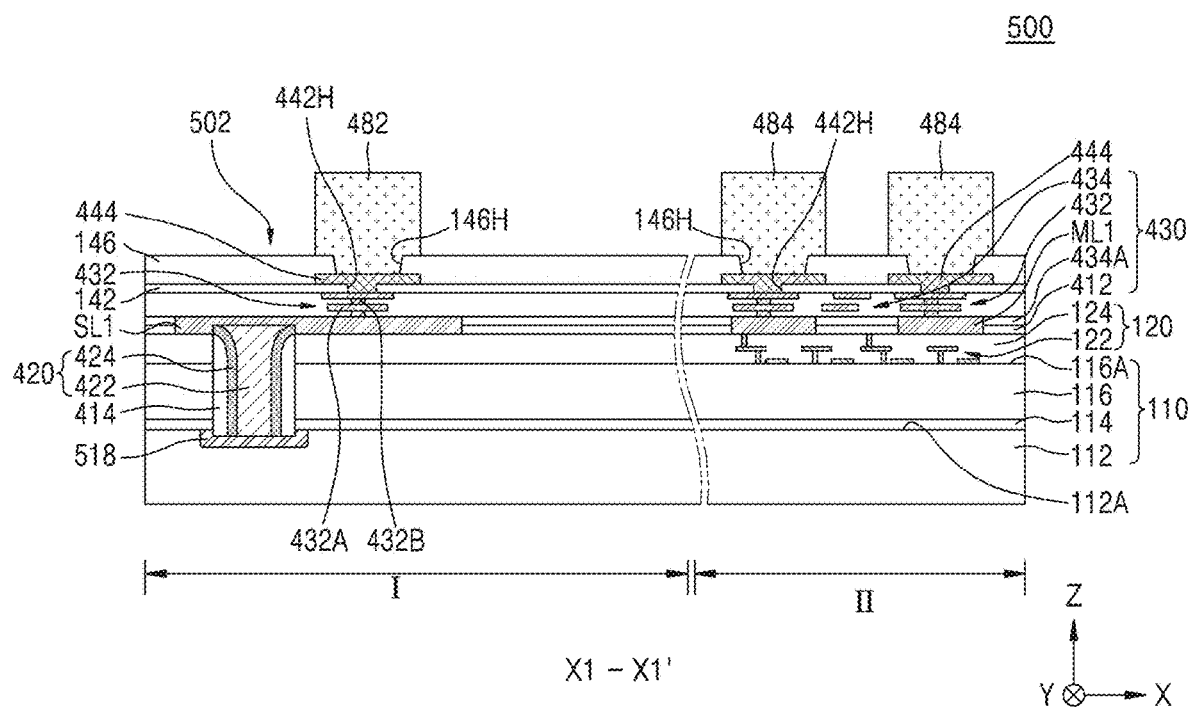
FIG. 5 is a cross-sectional view of a portion of an integrated circuit chip according to some embodiments of the inventive concepts.

FIG. 5 is a cross-sectional view of a portion of an integrated circuit chip 500 according to some embodiments of the inventive concepts.

Referring to FIG. 5, the integrated circuit chip 500 may have generally the same configuration as the integrated circuit chip 400 illustrated in FIGS. 4A and 4B. However, the integrated circuit chip 500 may include a conductive ion implantation region 518 instead of the conductive ion implantation region 118 illustrated in FIG. 4B. The integrated circuit chip 500 may include an electromagnetic shielding structure 502 that provides a conductive path for electromagnetic shielding in the electromagnetic shielding contact region I. The electromagnetic shielding structure 502 may have generally the same configuration as the electromagnetic shielding structure 402 illustrated in FIGS. 4A and 4B. However, one end of the penetrating electrode portion 420 in the electromagnetic shielding structure 502 may be in contact with the conductive ion implantation region 518.

The conductive ion implantation region 518 may be locally formed around the penetrating electrode portion 420 in the first surface 112A contacting the penetrating electrode portion 420 and the buried insulating film 114 in the bulk substrate 112. The conductive ion implantation region 518 may not be formed in a region of the bulk substrate 112 that vertically overlaps with the integrated circuit portion 122, but may be formed in a region of the bulk substrate 112 that does not vertically overlap with the integrated circuit portion 122. The conductive ion implantation region 518 may be formed only in the electromagnetic shielding contact region I of the bulk substrate 112 and not in the integrated circuit device region II. A more detailed configuration of the conductive ion implantation region 518 is the same as that described for the conductive ion implantation region 318 with reference to FIG. 3.

Figure 6:
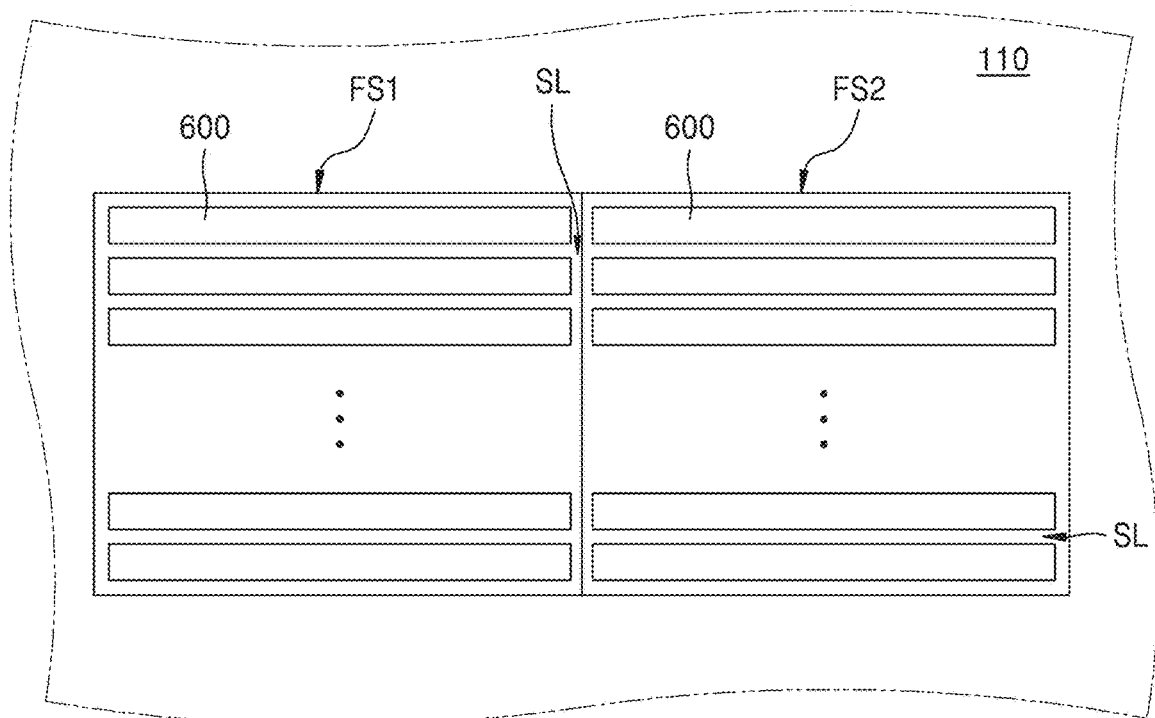
FIG. 6 is a schematic plan view of a plurality of integrated circuit chips according to some embodiments of the inventive concepts.

FIG. 6 is a schematic plan view of a plurality of integrated circuit chips according to embodiments of the inventive concepts. FIG. 6 illustrates a plurality of integrated circuit chips 600 included in two full-shots FS1 and FS2 among the plurality of integrated circuit chips 600 formed on an SOI substrate 110. The plurality of integrated circuit chips 600 in FIG. 6 illustrate a state before they are separated and individualized from each other by a sawing process. The plurality of integrated circuit chips 600 on the SOI substrate 110 are spaced apart from each other with a scribe lane SL therebetween. The plurality of integrated circuit chips 600 may be included in each of the full shots FS1 and FS2. The plurality of integrated circuit chips 600 may have any one of the structures of the integrated circuit chips 100, 200, 300, 400, and 500 described with reference to FIGS. 1A to 5, respectively. The SOI substrate 110 may include the conductive ion implantation region 118 formed entirely on the side of the first surface 112A of the bulk substrate 112 of the SOI substrate 110 as illustrated in FIGS. 1B, 2B, and 4B, or may include the conductive ion implantation regions 318 and 518 locally formed only in a portion of the electromagnetic shielding contact region I of the bulk substrate 112 of the SOI substrate 110 as illustrated in FIGS. 3 and 5.

The plurality of integrated circuit chips 600 may include memory chips or non-memory chips, respectively. In some embodiments, the plurality of integrated circuit chips 600 may each constitute a display driver IC (DDI) chip.

Figure 7:
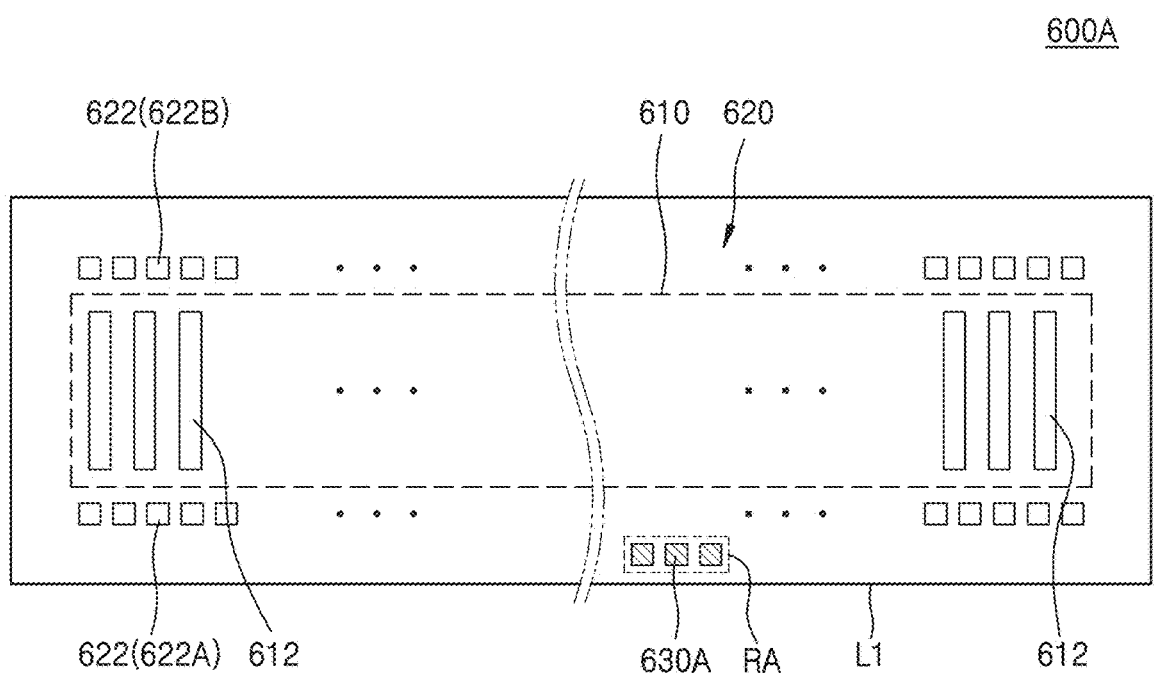
FIGS. 7 to 10 are plan views showing an example configuration of an integrated circuit chip according to some embodiments of the inventive concepts.

FIG. 7 is a plan view showing an example configuration of an integrated circuit chip 600A according to some embodiments of the inventive concepts.

Referring to FIG. 7, the integrated circuit chip 600A may constitute at least a part of the plurality of integrated circuit chips 600 illustrated in FIG. 6. The integrated circuit chip 600A may include a circuit region 610 and a peripheral region 620 arranged around the circuit region 610. In FIG. 7, the boundary between the circuit region 610 and the peripheral region 620 is represented by a dashed line for the sake of convenience, but the boundary between the circuit region 610 and the peripheral region 620 may not be physically distinguished. The circuit region 610 and the peripheral region 620 may correspond to the integrated circuit device region II of the integrated circuit chips 100, 200, 300, 400, and 500 described with reference to FIGS. 1A to 5.

In the circuit region 610, a plurality of driver circuit cells 612 and a plurality of interconnection patterns (not shown) may be arranged. A plurality of electrode pads 622 may be formed in the peripheral region 620. The plurality of electrode pads 622 may include a plurality of input electrode pads 622A and a plurality of output electrode pads 622B. Each of the plurality of driver circuit cells 612 may be electrically connected to the plurality of electrode pads 622 through the plurality of interconnection patterns. The plurality of driver circuit cells 612 may generate data signals for driving a display panel, for example, a display panel 2300 illustrated in FIG. 12, and output them to the output electrode pad 622B, in response to driving control signals and a power supply signal applied through the input electrode pad 622A from an external device, for example, an external printed circuit board. The plurality of driver circuit cells 612 may include a shift register, a data register, a line latch unit, a digital-analog conversion unit, an output buffer unit, and the like, but the inventive concepts is not limited thereto.

The plurality of input electrode pads 622A together with the input connection terminals may constitute an input part of the integrated circuit chip 600A, and the plurality of output electrode pads 622B together with the output connection terminals may constitute an output part of the integrated circuit chip 600A. In some embodiments, each of the input connection terminals and the output connection terminals may be selected from the plurality of second connection terminals 184 and 484, which are described with reference to FIGS. 1A to 5.

The integrated circuit chip 600A may have an electromagnetic shielding contact region RA including electromagnetic shielding structures 630A. The electromagnetic shielding contact region RA may correspond to the electromagnetic shielding contact region I of the integrated circuit chips 100, 200, 300, 400, 500 described with reference to FIGS. 1A to 5. FIG. 7 illustrates a case where three electromagnetic shielding structures 630A each having an island-shaped planar structure are included in the electromagnetic shielding contact region RA, but this is merely an example, and one or more electromagnetic shielding structures 630A may be included. The electromagnetic shielding contact region RA may be arranged adjacent to an edge of a long side L1 of the integrated circuit chip 600A, and the plurality of electromagnetic shielding structures 630A may be arranged in a line along the longitudinal direction of the long side L1. The integrated circuit chip 600A may include the SOI substrate 110 described with reference to FIGS. 1A to 6, and each of the plurality of electromagnetic shielding structures 630A may include any one of the electromagnetic shielding structures 102, 202, 302, 402, and 502 described with reference to FIGS. 1B, 2B, 3, 4B, and 5.

Figure 8:
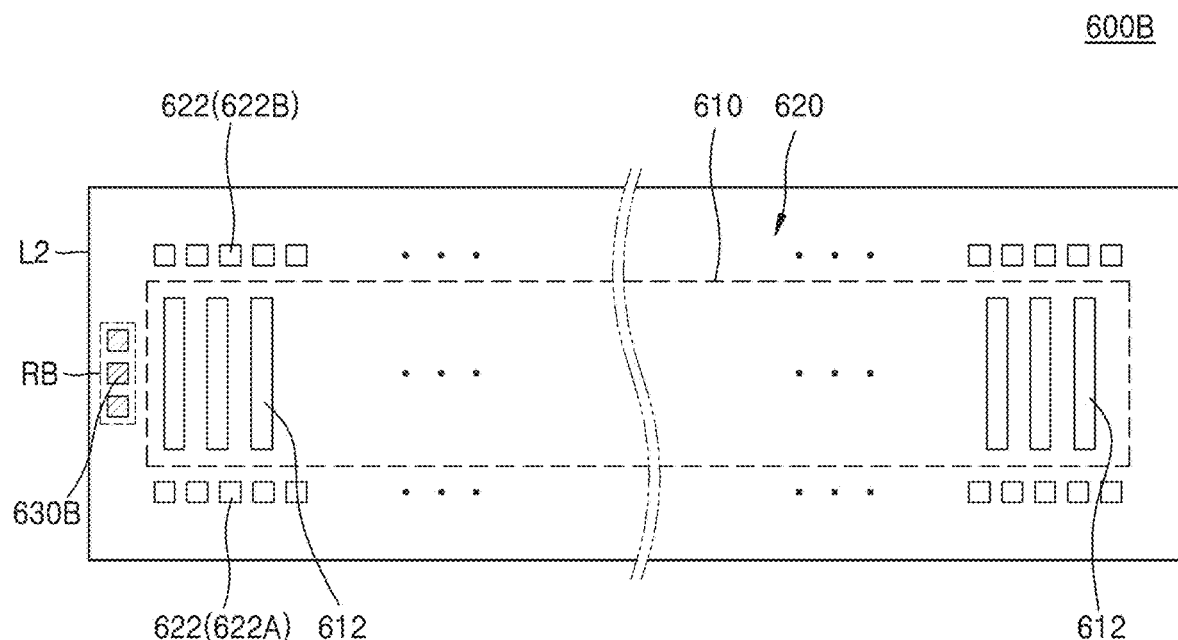

FIG. 8 is a plan view showing an example configuration of an integrated circuit chip 600B according to some embodiments of the inventive concepts.

Referring to FIG. 8, the integrated circuit chip 600B may constitute at least a part of the plurality of integrated circuit chips 600 illustrated in FIG. 6. The integrated circuit chip 600B may have generally the same configuration as the integrated circuit chip 600A illustrated in FIG. 7. However, the integrated circuit chip 600B may have the electromagnetic shielding contact region RB including electromagnetic shielding structures 630B. The electromagnetic shielding contact region RB may correspond to the electromagnetic shielding contact region I of the integrated circuit chips 100, 200, 300, 400, 500 described with reference to FIGS. 1A to 5. FIG. 8 illustrates a case where three electromagnetic shielding structures 630B each having an island-shaped planar structure are included in the electromagnetic shielding contact region RB, but this is merely an example, and one, two, or four or more electromagnetic shielding structure 630B may be included. The electromagnetic shielding contact region RB may be arranged adjacent to an edge of a short side L2 of the integrated circuit chip 600B and the plurality of electromagnetic shielding structures 630B may be arranged in a line along the longitudinal direction of the short side L2. The integrated circuit chip 600B may include the SOI substrate 110 described with reference to FIGS. 1A to 6, and each of the plurality of electromagnetic shielding structures 630B may include any one of the electromagnetic shielding structures 102, 202, 302, 402, and 502 described with reference to FIGS. 1B, 2B, 3, 4B, and 5.

Figure 9:
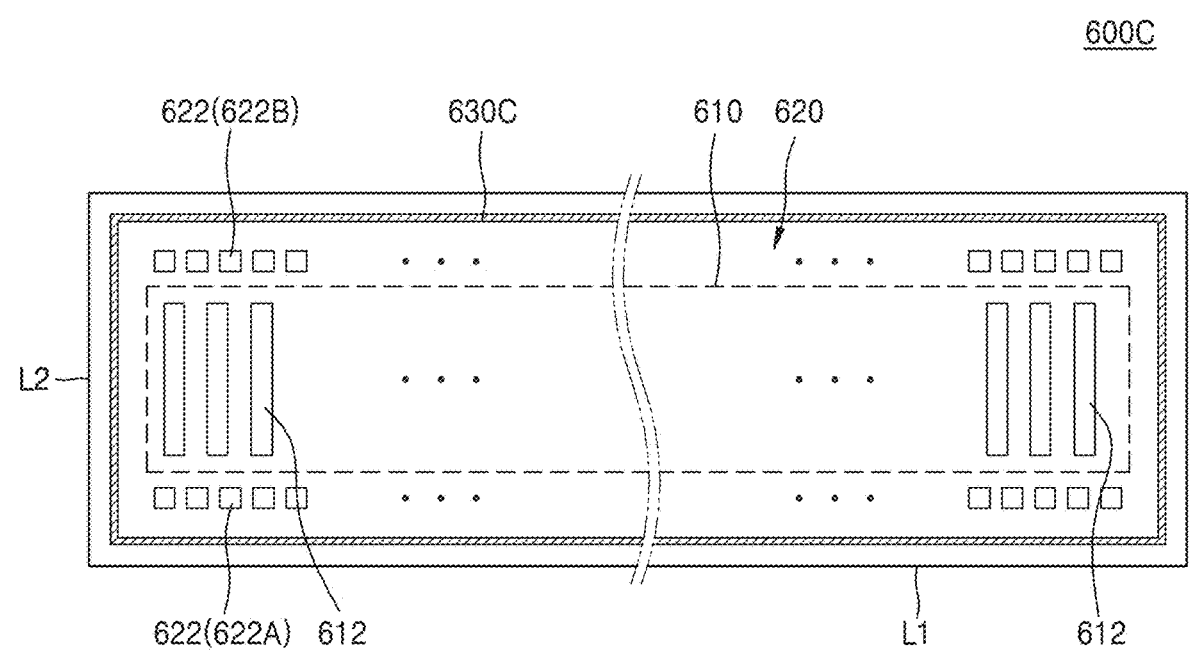

FIG. 9 is a plan view showing an example configuration of an integrated circuit chip 600C according to some embodiments of the inventive concepts.

Referring to FIG. 9, the integrated circuit chip 600C may constitute at least a part of the plurality of integrated circuit chips 600 illustrated in FIG. 6. The integrated circuit chip 600C may have generally the same configuration as the integrated circuit chip 600A illustrated in FIG. 7. However, the integrated circuit chip 600C may include an electromagnetic shielding structure 630C having a ring-shaped planar structure.

The electromagnetic shielding structure 630C may be arranged adjacent to an edge of the integrated circuit chip 600C to surround a circuit region 610 and a peripheral region 620, and may be extended in the longitudinal direction of each of a long side L1 and a short side L2. The integrated circuit chip 600C may include the SOI substrate 110 described with reference to FIGS. 1A to 6, and the electromagnetic shielding structure 630C may include any one of the plurality of electromagnetic shielding structures 102, 202, 302, 402, and 502 illustrated in FIGS. 1B, 2B, 3, 4B, and 5 and an electromagnetic shielding structures modified and changed within the scope of the inventive concepts.

In some embodiments, the electromagnetic shielding structure 630C may perform a crack stopper function for protecting the circuits and the interconnection structures formed in the circuit regions 610 and the peripheral regions 620 from being physically damaged, a moisture blocking function for protecting the circuits and the interconnection structures formed in the circuit regions 610 and the peripheral regions 620 from moisture, or a electrostatic discharge (ESD) function capable of blocking abrupt surges in the circuits and the interconnection structures formed in the circuit regions 610 and the peripheral regions 620.

Figure 10:
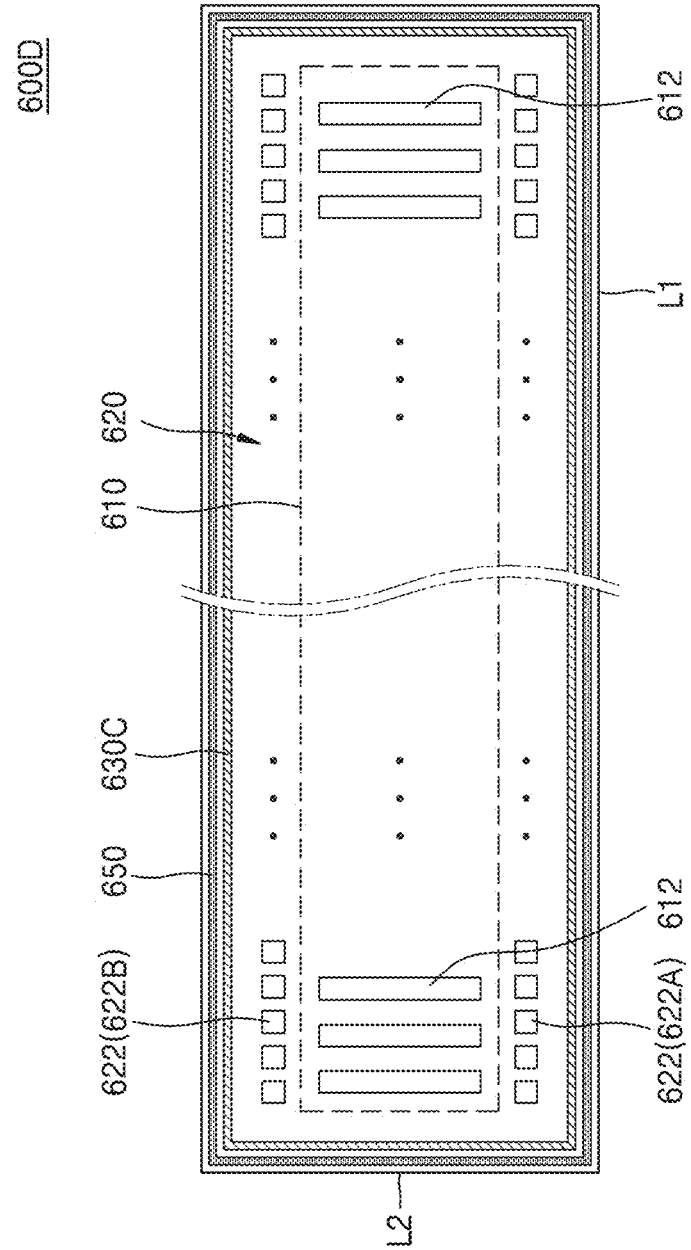

FIG. 10 is a plan view showing an example configuration of an integrated circuit chip 600D according to some embodiments of the inventive concepts.

Referring to FIG. 10, the integrated circuit chip 600D may constitute at least a part of the plurality of integrated circuit chips 600 illustrated in FIG. 6. The integrated circuit chip 600D may have generally the same configuration as the integrated circuit chip 600C illustrated in FIG. 9. However, the integrated circuit chip 600D may further include a guard ring 650 arranged between an edge of the integrated circuit chip 600D and the electromagnetic shielding structure 630C.

The guard ring 650 may include a conductor for protecting the circuits and the interconnection structures formed in the circuit regions 610 and the peripheral regions 620 and protecting the electromagnetic shielding structure 630C. For example, the guard ring 650 may include a single-layer or multilayer structure of a metal film.

In some embodiments, the guard ring 650 may function as a crack stopper for protecting the circuits and the interconnection structures formed in the circuit region 610 and the peripheral region 620 and the electromagnetic shielding structure 630C from being physically damaged. In some embodiments, the guard ring 650 may function as a moisture barrier for protecting the circuits and the interconnection structures formed in the circuit region 610 and the peripheral region 620 and the electromagnetic shielding structure 630C from the moisture. In some embodiments, the guard ring 650 may perform an ESD function capable of blocking abrupt surge in the circuits and the interconnection structures formed in the circuit region 610 and the peripheral region 620.

The integrated circuit chip 600D may include the SOI substrate 110 described with reference to FIGS. 1A to 6.

The integrated circuit chips 600A, 600B, 600C and 600D described with reference to FIGS. 7 to 10 may include the conductive ion implantation region 118 formed entirely on the side of the first surface 112A in the bulk substrate 112 of the SOI substrate 110 as illustrated in FIGS. 1B, 2B and 4B, or the conductive ion implantation regions 318 and 518 formed only locally in a portion of the electromagnetic shielding contact region I in the bulk substrate 112 of the SOI substrate 110 as illustrated in FIGS. 3 and 5.

One end of the guard ring 650 illustrated in FIG. 10 may be configured to be electrically connected to the conductive ion implantation region 118, the conductive ion implantation region 318, or the conductive ion implantation region 518. In this case, by applying a ground voltage to the guard ring 650 and the electromagnetic shielding structure 630C in the integrated circuit chip 600D, the integrated circuit chip 600D may be protected from the instantaneous ESD introduced from the outside and/or the high current surge.

The integrated circuit chips 100, 200, 300, 400, 500, 600, 600A, 600B, 600C and 600D according to the inventive concepts may include the electromagnetic shielding structures 102, 202, 302, 402, 502 for shielding internal EMI of the integrated circuit chips 100, 200, 300, 400, 500, 600, 600A, 600B, 600C and 600D. Thus, an integrated circuit package including the integrated circuit chips 100, 200, 300, 400, 500, 600, 600A, 600B, 600C, and 600D may need not t a separate shielding structure for shielding EMI on the outside of the integrated circuit chips 100, 200, 300, 400, 500, 600A, 600B, 600C, and 600D. Accordingly, there is no need to secure a space for forming a separate shielding structure on the outside of the integrated circuit chip, and therefore it may be advantageously applied to a display apparatus using FFD (full front display).

Figure 11A:
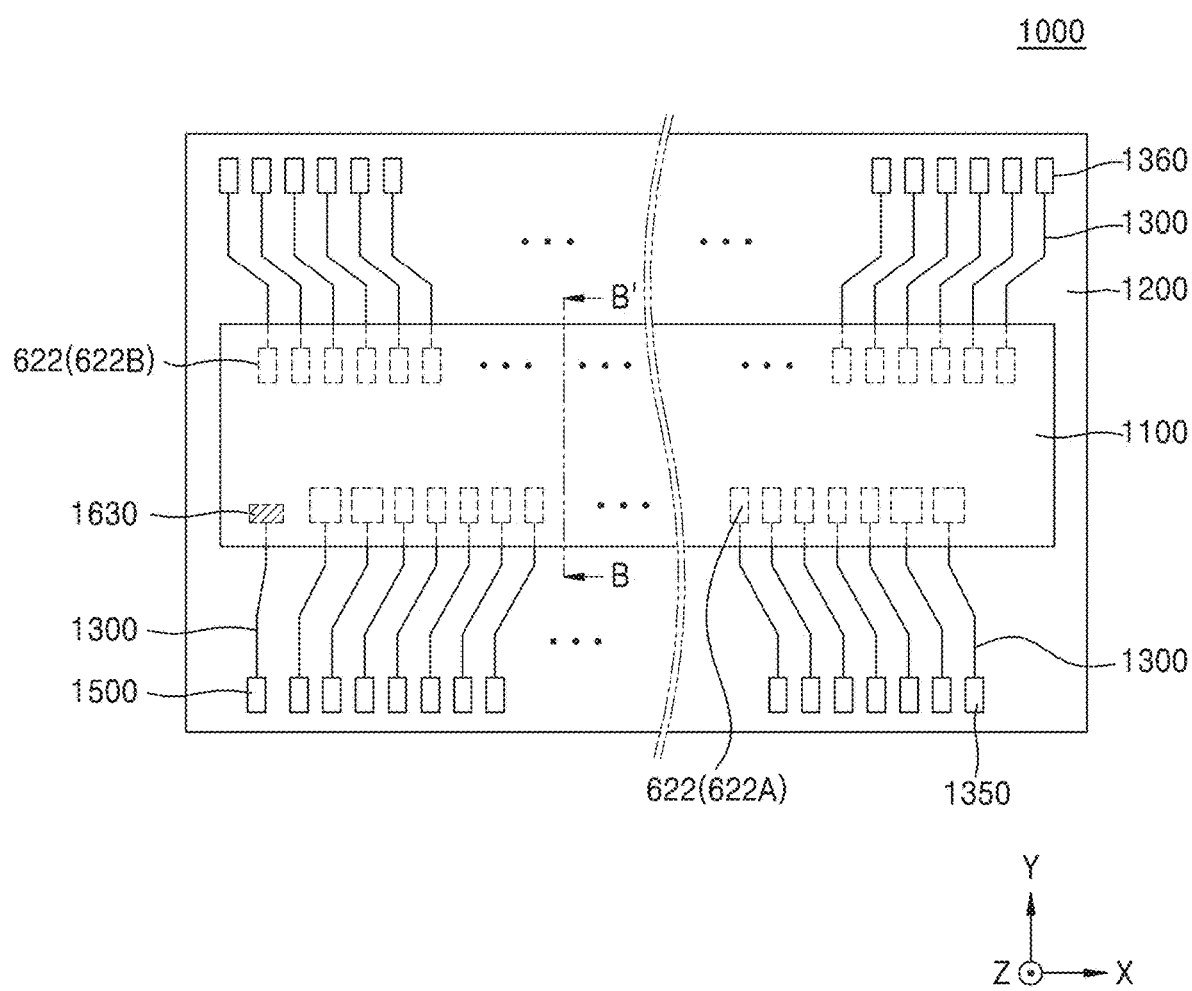
FIG. 11A is a schematic plan view of an integrated circuit package according to some embodiments of the inventive concepts.
Figure 11B:
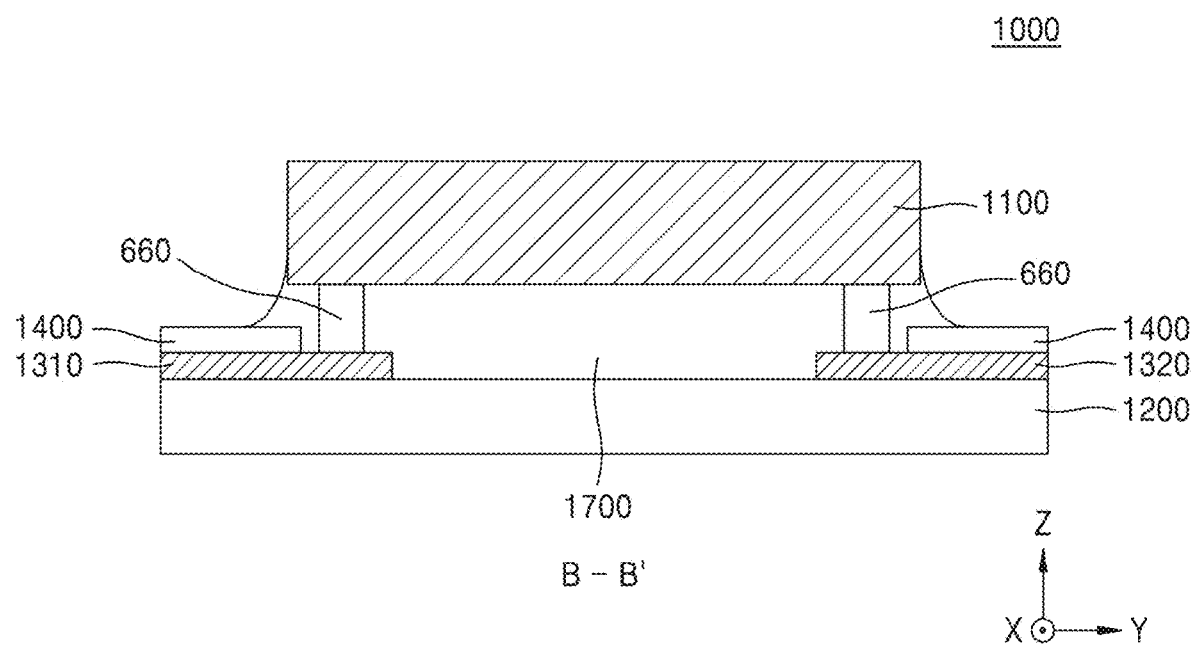
FIG. 11B is an enlarged cross-sectional view taken along line B-B' of FIG. 11A.

FIG. 11A is a schematic plan view of an integrated circuit package 1000 according to embodiments of the inventive concepts, and FIG. 11B is an enlarged cross-sectional view taken along line B-B' of FIG. 11A.

Referring to FIGS. 11A and 11B, the integrated circuit package 1000 may include an integrated circuit chip 1100 and a supporting substrate 1200 having a mounting surface on which the integrated circuit chip 1100 is mounted.

Figure 12:
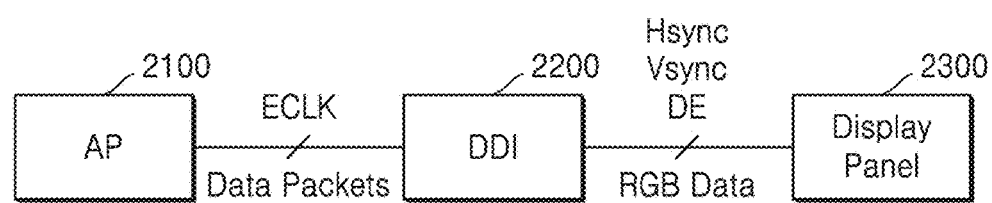
FIG. 12 is an example block diagram for explaining a display apparatus according to the inventive concepts.

In some embodiments, the integrated circuit chip 1100 may be a source driving chip that receives a signal voltage from an external device, for example, an external printed circuit board, and that generates an image signal, and that outputs the image signal to a data line of a display panel, for example, the display panel 2300 illustrated in FIG. 12. In some embodiments, the integrated circuit chip 1100 may be a gate driving chip that generates a scan signal including the on/off signal of a transistor and outputs the scan signal to a gate line of the display panel. The integrated circuit chip 1100 may have any one of the structures of the integrated circuit chips 100, 200, 300, 400, 500, 600, 600A, 600B, 600C, and 600D described with reference to FIGS. 1A to 10.

In some embodiments, the supporting substrate 1200 may include a flexible film. For example, the supporting substrate 1200 may include polyimide, but is not limited thereto. The integrated circuit chip 1100 may be mounted on a mounting surface of the supporting substrate 1200 in a flip chip bonding manner through a plurality of electrode pads 622 and a plurality of connection terminals 660 connected to the plurality of electrode pads 622.

A plurality of interconnections 1300 may be formed on the supporting substrate 1200. The plurality of interconnections 1300 may include metal, for example, copper. The plurality of interconnections 1300 may include an input interconnection portion 1310 and an output interconnection portion 1320. A plurality of input electrode pads 622A may be connected to the input interconnection electrode 1350 through the input interconnection portion 1310, and a plurality of output electrode pads 622B may be connected to the output interconnection electrode 1360 through the output interconnection portion 1320.

As illustrated in FIG. 11B, a solder resist layer 1400 may be formed over the supporting substrate 1200. The solder resist layer 1400 may cover at least a part of the plurality of interconnections 1300. A portion connected to the connection terminal 660 in each of the input interconnection portions 1310 and the output interconnection portions 1320 of the plurality of interconnections 1300 may not be covered with the solder resist layer 1400. The solder resist layer 1400 may include an insulating ink, a photosensitive solder resist, or a solder resist film.

An underfill layer 1700 may be filled between the integrated circuit chip 1100 and the supporting substrate 1200 to mitigate or prevent physical and/or chemical damage of the coupled structures of the integrated circuit chip 1100 and the supporting substrate 1200. The underfill layer 1700 may include an epoxy resin.

The integrated circuit chip 1100 may include at least one electromagnetic shielding structure 1630. FIG. 11A illustrates a case where the integrated circuit chip 1100 includes one electromagnetic shielding structure 1630 having an island-shaped planar structure. However, the integrated circuit chip 1100 may include a plurality of electromagnetic shielding structures 1630. In some embodiments, the integrated circuit chip 1100 may include an electromagnetic shielding structure having a ring-shaped planar structure similar to the electromagnetic shielding structure 630C described with reference to FIG. 9, instead of the electromagnetic shielding structure 1630 having an island-shaped planar structure. The electromagnetic shielding structure 1630 may have any one of the electromagnetic shielding structures 102, 202, 302, 402, and 502 described with reference to FIGS. 1B, 2B, 3, 4B, and 5.

A ground electrode 1500 may be formed on the supporting substrate 1200. The electromagnetic shielding structure 1630 may be connected to the ground electrode 1500 through any one interconnection selected from the plurality of interconnections 1300.

The plurality of electrode pads 622 and a portion of the plurality of interconnections 1300 that overlaps with the integrated circuit chip 1100 in the vertical direction (the Z direction) may be arranged under the integrated circuit chip 1100. Thus, when it is shown over the schematic plan view illustrated in FIG. 11A, the plurality of electrode pads 622 and the portion covered by the integrated circuit chip 1100 among the plurality of interconnections 1300 may not be seen.

Since the integrated circuit package 1000 according to the inventive concepts includes the electromagnetic shielding structure for shielding internal EMI of the integrated circuit chip 1100, there is no need to form a separate shielding structure for shielding EMI on the outside of the integrated circuit chip 1100. Therefore, it is possible to overcome the structural limitations due to the increase of the occupied area of a separate shielding structure provided on the outside of the integrated circuit chip 1100, and the integrated circuit chip 1100 may be advantageously applied to a display apparatus using FFD.

FIG. 12 is an example block diagram for explaining a display apparatus 2000 according to the inventive concepts.

Referring to FIG. 12, the display apparatus 2000 may include an application processor (hereinafter referred to as "AP") 2100, a DDI chip 2200, and a display panel 2300.

The AP 2100 may control the overall operation of the display apparatus 2000, and input and output data packets having display data in response to a clock (ECLK). The data packets may include display data, a horizontal synchronization signal Hsync, a vertical synchronization signal Vsync, a data activating signal DE, and the like.

The DDI chip 2200 may receive the data packets from the AP 2100 and may output the horizontal synchronization signal Hsync, the vertical synchronization signal Vsync, the data activating signal DE, and a display data RGB Data. In some embodiments, the AP 2100 and the DDI chip 2200 may perform interfacing such as mobile industry processor interface (MIPI), mobile display digital interface (MDDI), compact display port (CDP), and the like. In some embodiments, the DDI chip 2200 may include a graphic memory (GRAM) for high speed serial interface with the AP 2100. In some embodiments, the DDI chip 2200 may buffer the data packets without using the GRAM for the high speed serial interface with the AP 2100 and output the display data.

The DDI chip 2200 may include any one of the integrated circuit chips 100, 200, 300, 400, 500, 600, 600A, 600B, 600C, and 600D described with reference to FIGS. 1A to 10.

The display panel 2300 may display the display data in frame units under the control of the DDI chip 2200. The display panel 2300 may include an organic light emitting display (OLED) panel, a liquid crystal display (LCD) panel, a plasma display (PDP) panel, an electrophoretic display panel, or an electrowetting display panel. In some embodiments, the display panel 2300 may be coupled to a touch screen (not shown) and configured to receive sensed data from the touch screen.

In the display apparatus 2000 according to the inventive concepts, the DDI chip 2200 may include an electromagnetic shielding structure for shielding EMI, for example, an electromagnetic shielding structure 102, 202, 302, 402, and 502, and the electromagnetic shielding structure 102, 202, 302, 402, and 502 may be included inside of the DDI chip 2200. Therefore, the display apparatus 2000 including the DDI chip 2200 need not have a separate shielding structure for shielding EMI on the outside of the DDI chip 2200. Accordingly, it is possible to reduce the area of bevel at the edge of the display apparatus 2000, thereby further widening the screen area and improving the space usability.

FIGS. 13A to 13M are cross-sectional views illustrating an example method of manufacturing an integrated circuit chip according to embodiments of the inventive concepts. The example method of manufacturing the integrated circuit chip 100 illustrated in FIGS. 1A and 1B will be described with reference to FIGS. 13A to 13M.

Figure 13A:
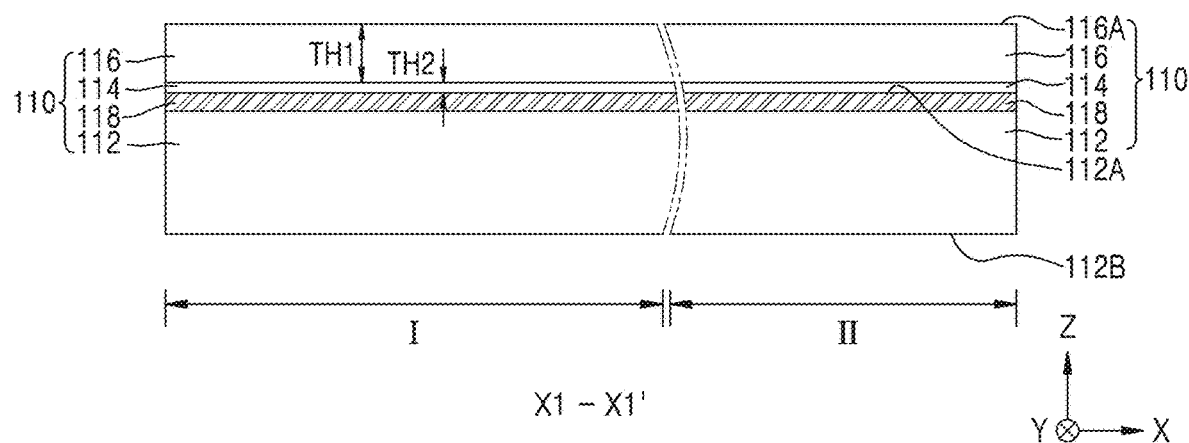
FIGS. 13A to 13M are sectional views for explaining an example method of manufacturing an integrated circuit chip according to some embodiments of the inventive concepts.

Referring to FIG. 13A, the SOI substrate 110 is provided. The SOI substrate 110 may include the electromagnetic shielding contact region I and the integrated circuit device region II. The SOI substrate 110 may have the structure in which the bulk substrate 112, the buried insulating film 114, and the semiconductor body layer 116 are sequentially stacked. The conductive ion implantation region 118 may be formed at a position adjacent to the buried insulating film 114 in the bulk substrate 112. The bulk substrate 112 may have the first surface 112A contacting with the buried insulating film 114 and a second surface 112B opposite to the first surface 112A. In order to form the SOI substrate 110 including the conductive ion implantation region 118, after the buried insulating film 114 is formed on the bulk substrate 112, the conductive ion implanted region 118 may be formed by implanting dopant ions into the bulk substrate 112 through the buried insulating film 114, extending along the first surface 112A of the bulk substrate 112 with a thickness from the first surface 112A to a portion of the bulk substrate 112. Thereafter, the semiconductor body layer 116 may be formed on the buried insulating film 114. In the SOI substrate 110, the thickness TH1 of the semiconductor body layer 116 may be greater than the thickness TH2 of the buried insulating film 114.

Figure 13B:
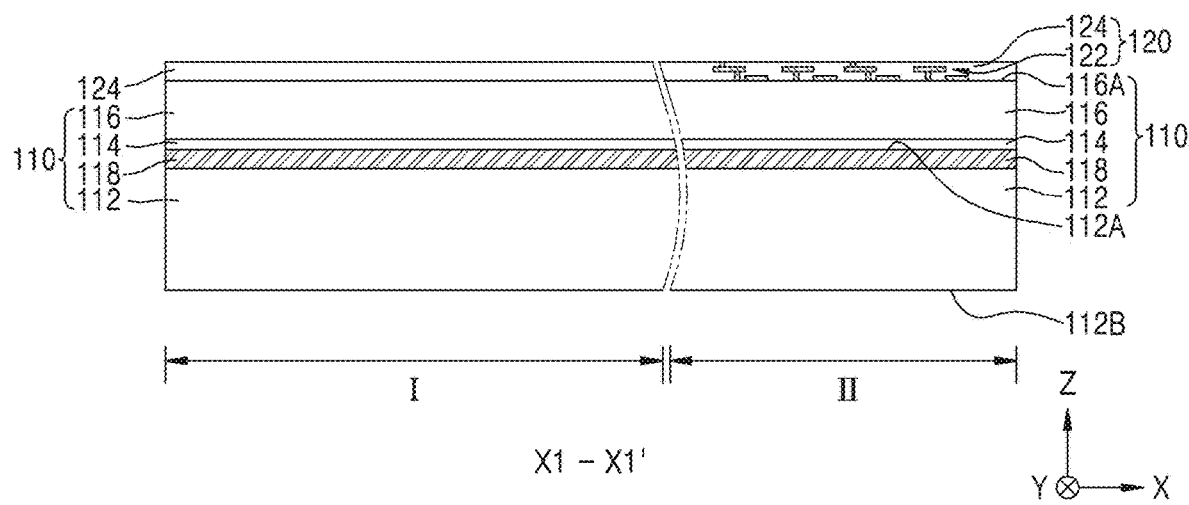

Referring to FIG. 13B, the FEOL structure 120 may be formed on the active surface 116A of the semiconductor body layer 116.

The FEOL structure 120 may include the integrated circuit portion 122 and the interlayer insulating film 124 for mutually insulating individual devices constituting the integrated circuit portion 122 from each other. The integrated circuit portion 122 may be formed only in the integrated circuit device region II from among the electromagnetic shielding contact region I and the integrated circuit device region II. The interlayer insulating film 124 may be formed to cover the semiconductor body layer 116 in the electromagnetic shielding contact region I and the integrated circuit device region II.

Figure 13C:
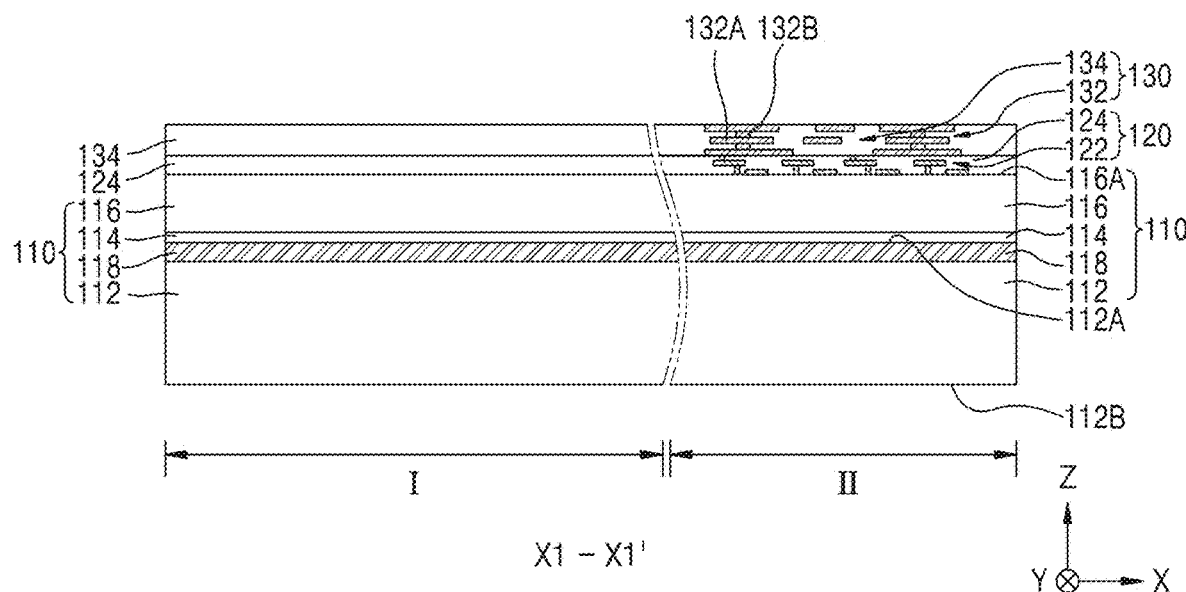

Referring to FIG. 13C, the BEOL structure 130 may be formed on the FEOL structure 120.

The BEOL structure 130 may include the plurality of multilayer interconnection structures 132 and the intermetal insulating film 134. The plurality of multilayer interconnection structures 132 may each include the plurality of interconnection layers 132A and the plurality of contact plugs 132B interconnecting the plurality of interconnection layers 132A therebetween. The plurality of multilayer interconnection structures 132 may be formed only in the integrated circuit device region II from among the electromagnetic shielding contact region I and the integrated circuit device region II. The intermetal insulating film 134 may be formed to cover the semiconductor body layer 116 in the electromagnetic shielding contact region I and the integrated circuit device region II.

Figure 13D:
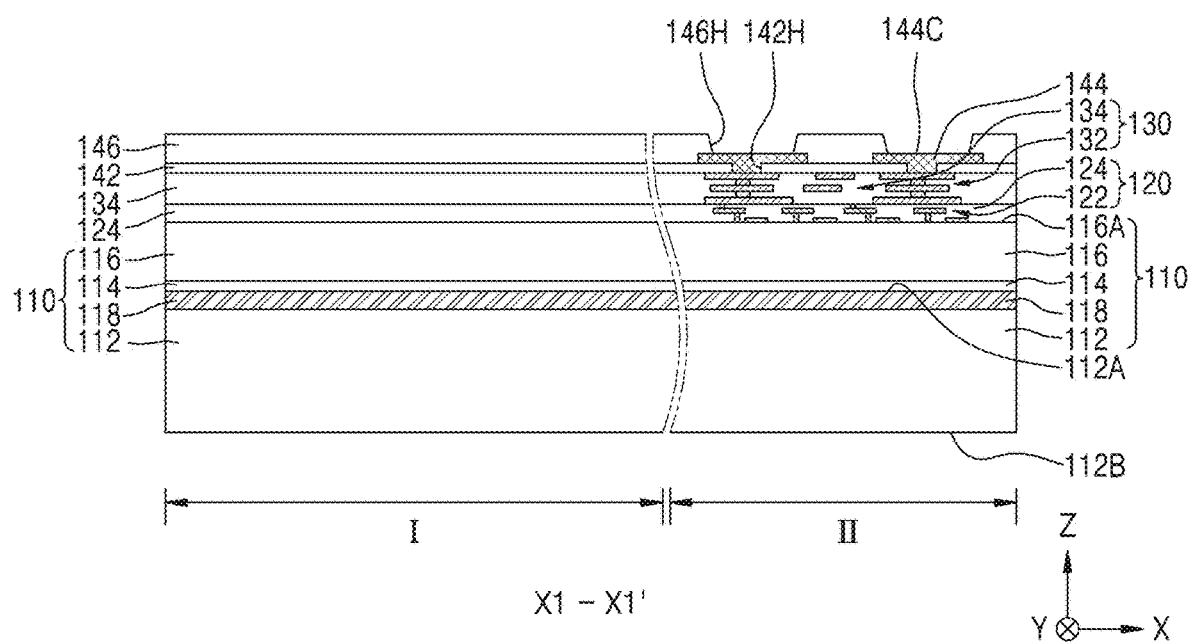

Referring to FIG. 13D, the first passivation film 142 may be formed to cover the BEOL structure 130 in the electromagnetic shielding contact region I and in the integrated circuit device region II, and to cover the plurality of contact pads 144 connected to the plurality of multilayer interconnection structures 132 in the integrated circuit device region II. Thereafter, the second passivation film 146 covering the first passivation film 142 and the plurality of contact pads 144 may be formed in the electromagnetic shielding contact region I and the integrated circuit device region II.

The plurality of contact pads 144 may be connected to the plurality of multilayer interconnection structures 132 through the plurality of first contact holes 142H formed in the first passivation film 142. The plurality of second contact holes 146H may be formed in the second passivation film 146 to expose the contact regions 144C of an upper surface of each of the plurality of contact pads 144.

Figure 13E:
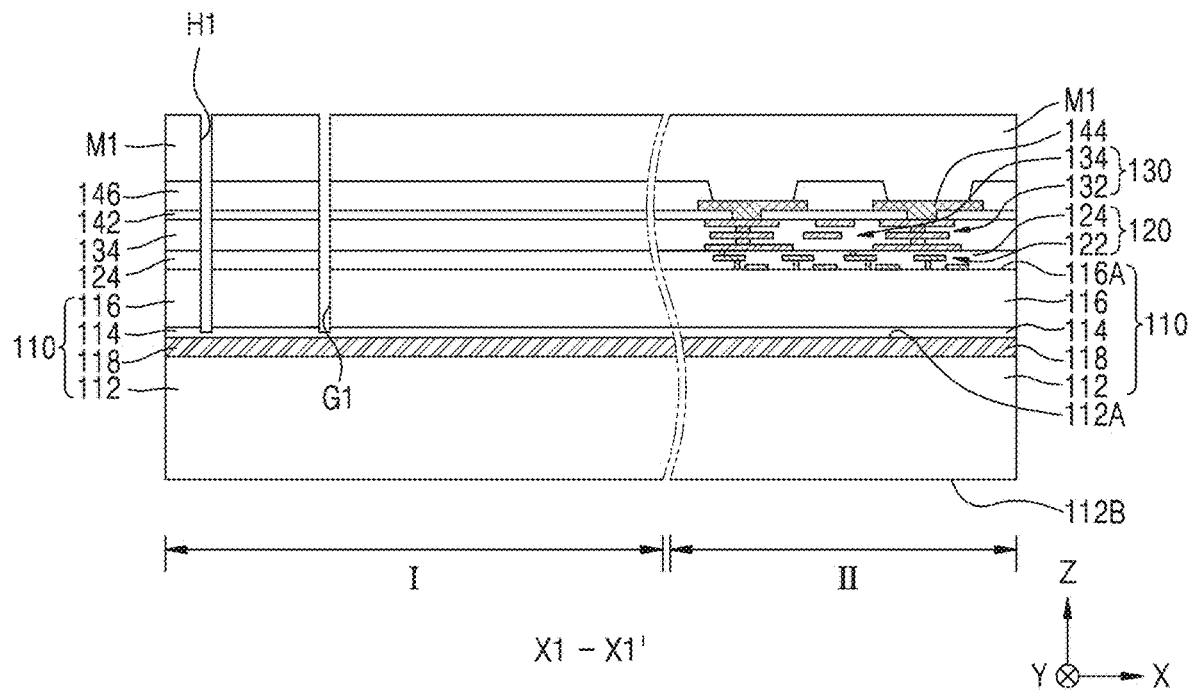

Referring to FIG. 13E, the first mask pattern M1 may be formed in the electromagnetic shielding contact region I and the integrated circuit device region II, covering the second passivation film 146 and the plurality of contact pads 144. The first mask pattern M1 may be formed with a first opening H1 having a ring-shaped planar structure. The first mask pattern M1 may include a photoresist pattern.

Using the first mask pattern M1 as an etching mask, the second passivation film 146 exposed through the first opening H1, the underlying first passivation film 142, the intermetal insulating film 134, the interlayer insulating film 124 and the semiconductor body layer 116 may be sequentially subjected to anisotropic etching to form the groove G1 having a bottom surface for exposing the buried insulating film 114. The groove G1 may have a ring-shaped planar structure.

Figure 13F:
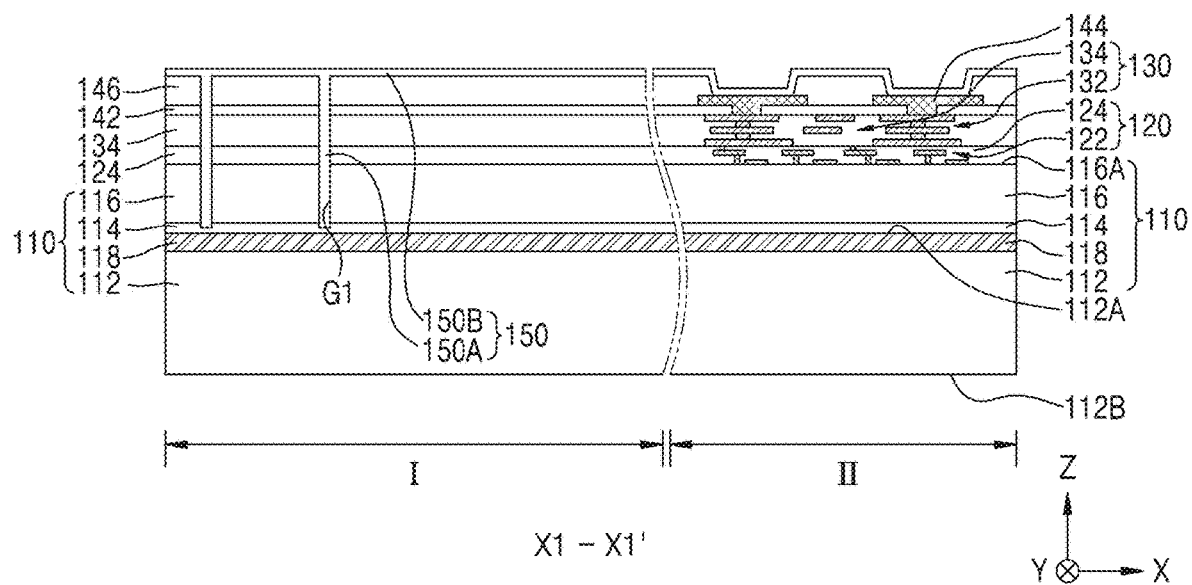

Referring to FIG. 13F, the first mask pattern M1 may be removed from the resultant of FIG. 13E, and then the insulating film 150 may be formed to cover the surface of the second passivation film 146, the surfaces of the plurality of contact pads 144 and fill the groove G1. The insulating film 150 may include the penetrating insulating portion 150A filling the groove G1 and the insulating liner portion 150B covering the surface of the second passivation film 146 and the surfaces of the plurality of contact pads 144 outside the groove G1.

Figure 13G:
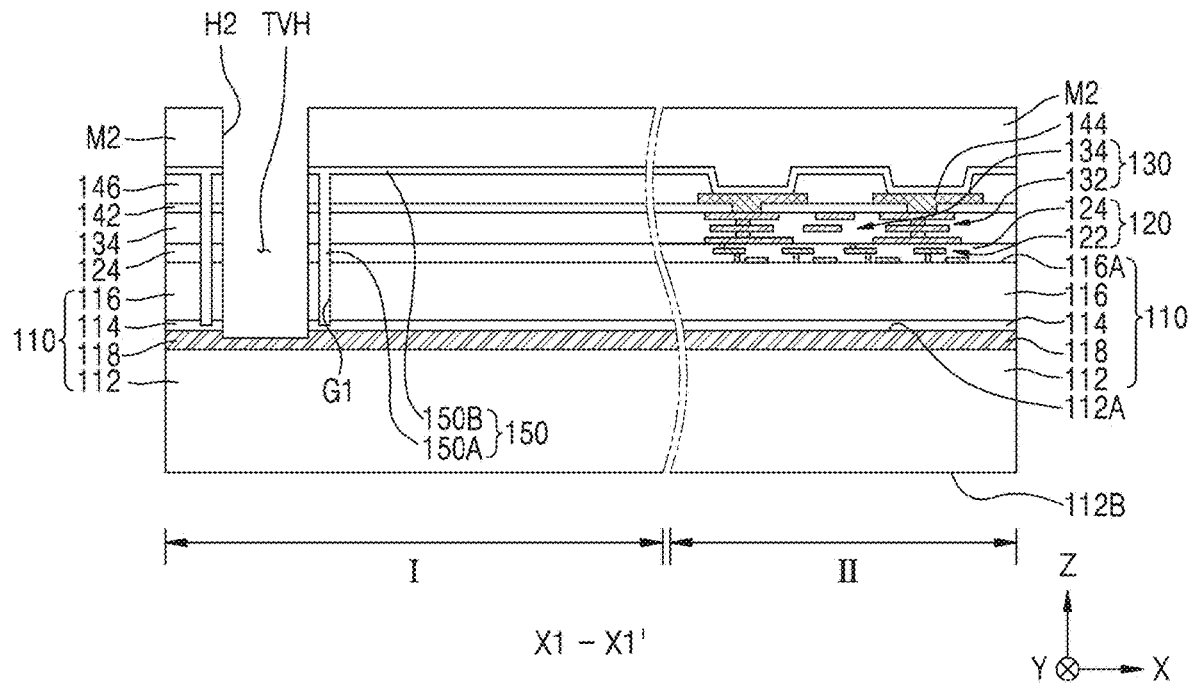

Referring to FIG. 13G, the second mask pattern M2 having a second opening H2 may be formed on the insulating film 150 in the electromagnetic shielding contact region I and the integrated circuit device region II. Thereafter, using the pattern M2 as an etching mask, the insulating liner portion 150B exposed through the second opening H2, the underlying second passivation film 146, the first passivation film 142, the intermetal insulating film 134, the interlayer insulating film 124, the semiconductor body layer 116 and the buried insulating film 114 may be sequentially subjected to anisotropic etching to form the through via hole TVH having a bottom surface for exposing the conductive ion implantation region 118. The second mask pattern M2 may include a photoresist pattern. The through via hole TVH may be formed at a position spaced apart from the penetrating insulating portion 150A in a planar region defined by the penetrating insulating portion 150A.

Figure 13H:
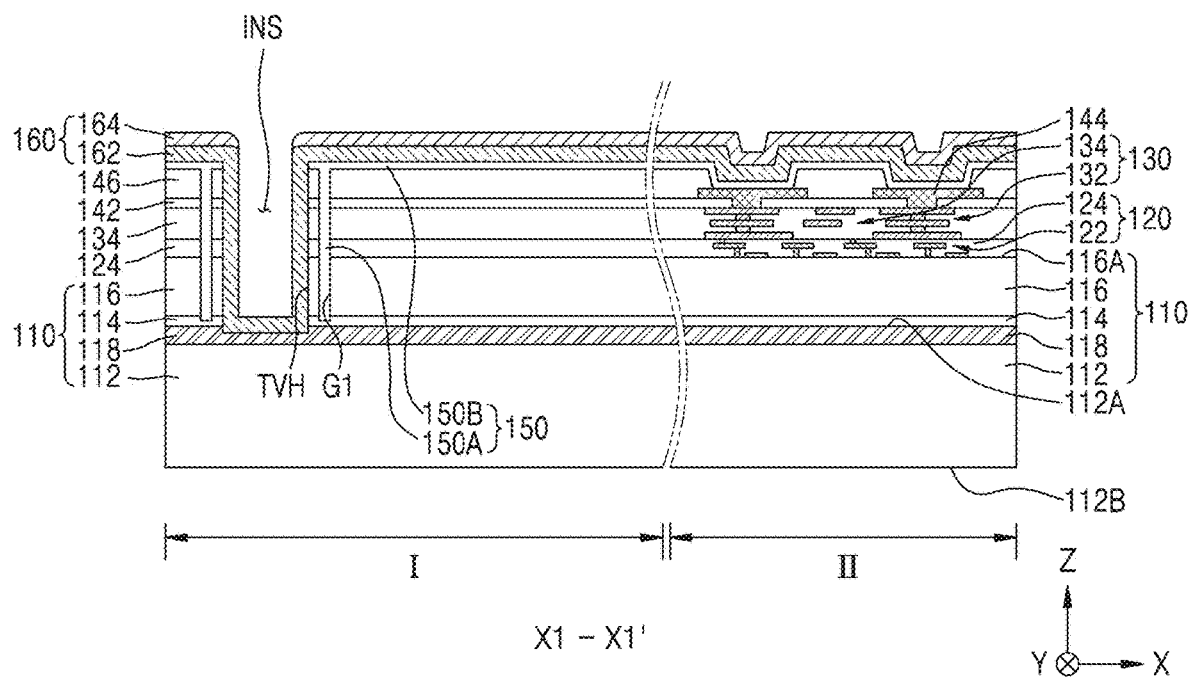

Referring to FIG. 13H, the second mask pattern M2 may be removed from the resultant structure of FIG. 13G, and then the conductive layer 160 may be formed, covering the bottom and sidewalls of the through via holes TVH and the upper surface of the insulating liner portion 150B.

The conductive layer 160 may include the first conductive layer 162 that conformally covers the bottom and sidewalls in the through via hole TVH and the upper surface of the insulating liner portion 150B. The conductive layer 160 may also include the second conductive layer 164 covering the upper surface of the first conductive layer 162 over the insulating liner portion 150B. In some embodiments, by controlling deposition conditions such as step coverage during the deposition process for forming the second conductive layer 164, the second conductive layer 164 may be formed to cover the first conductive layer 162 outside of the through via hole TVH while not being formed inside of the through via hole TVH. In some embodiments, the second conductive layer 164 may be formed to include a portion covering the first conductive layer 162 inside of the through via hole TVH. After the conductive layer 160 is formed, the inner insulation space INS defined by the conductive layer 160 may remain in the through via hole TVH.

Figure 13I:
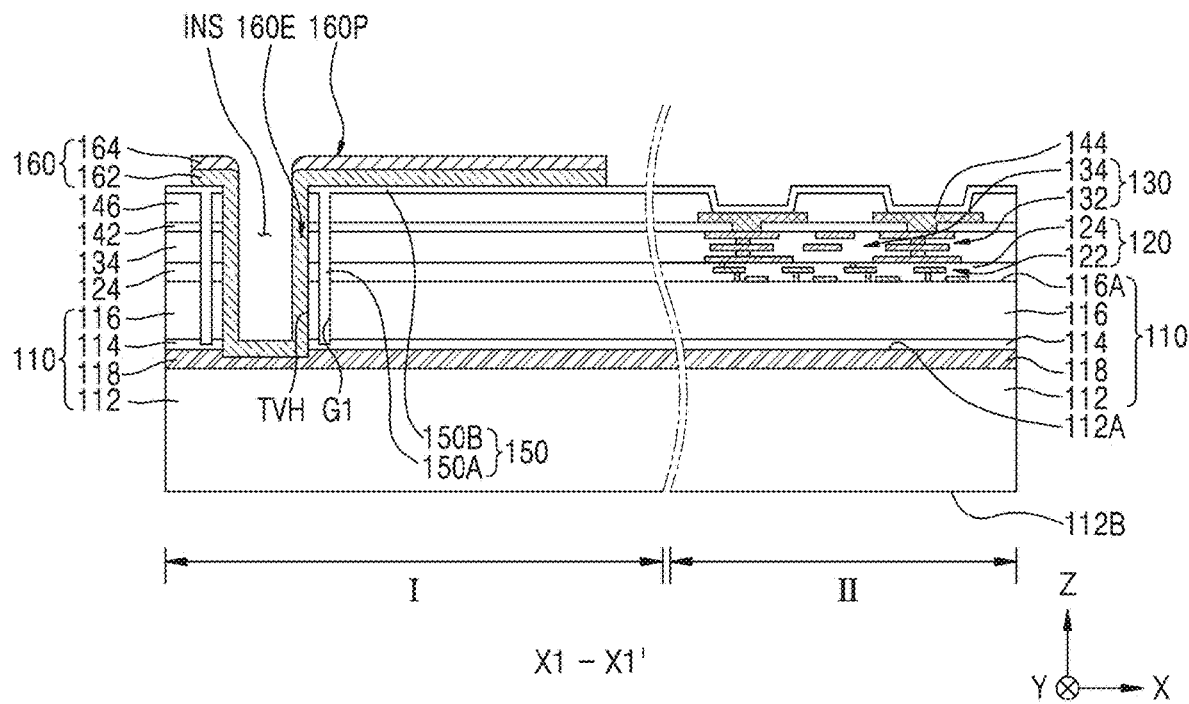

Referring to FIG. 13I, a portion of the conductive layer 160 may be removed so that the conductive layer 160 remains only in the electromagnetic shielding contact region I, thereby forming the penetrating electrode portion 160E and the ground pad portion 160P made of a remaining portion of the conductive layer 160. After the penetrating electrode portion 160E and the ground pad portion 160P are formed, the insulating liner portion 150B may be exposed around the ground pad portion 160P.

Figure 13J:
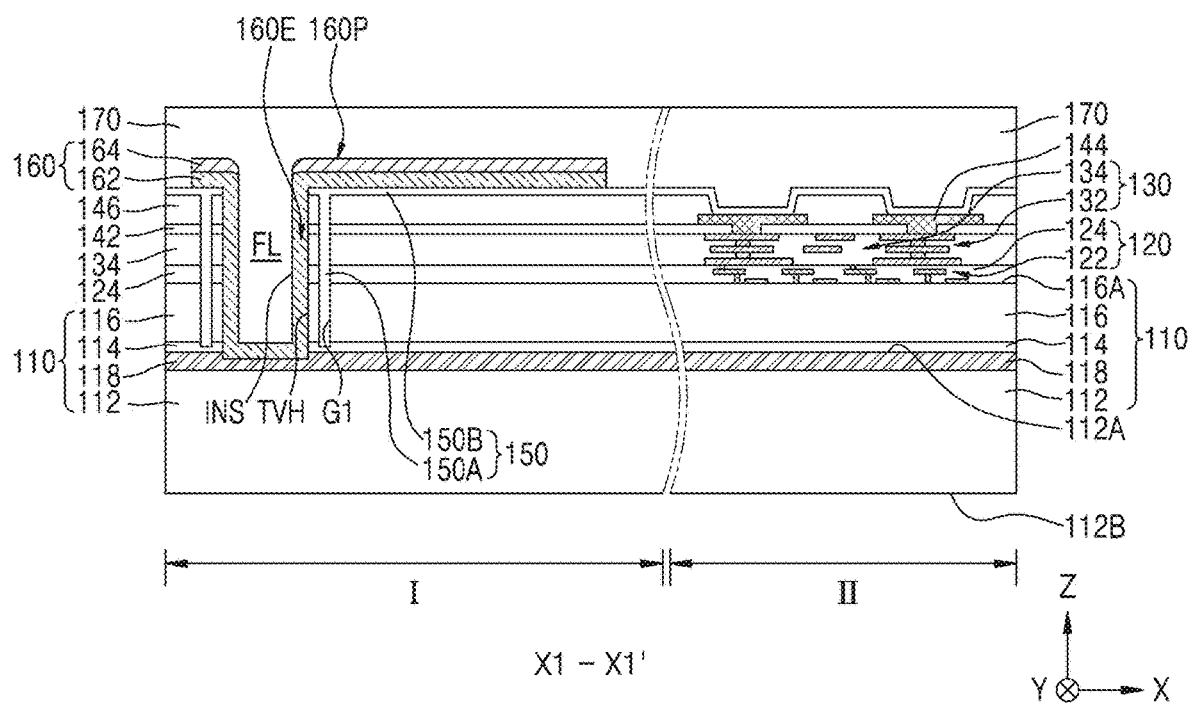

Referring to FIG. 13J, the third passivation film 170 may be formed in the electromagnetic shielding contact region I and the integrated circuit device region II, covering the penetrating electrode portion 160E, the ground pad portion 160P, and the insulating liner portion 150B.

The inner insulating space INS may be filled with a filling insulating film FL. In one example embodiment, the filling insulating film FL may be a portion of the third passivation film 170. In some embodiments, the filling insulating film FL may be a separate film, different from the third passivation film 170.

Figure 13K:
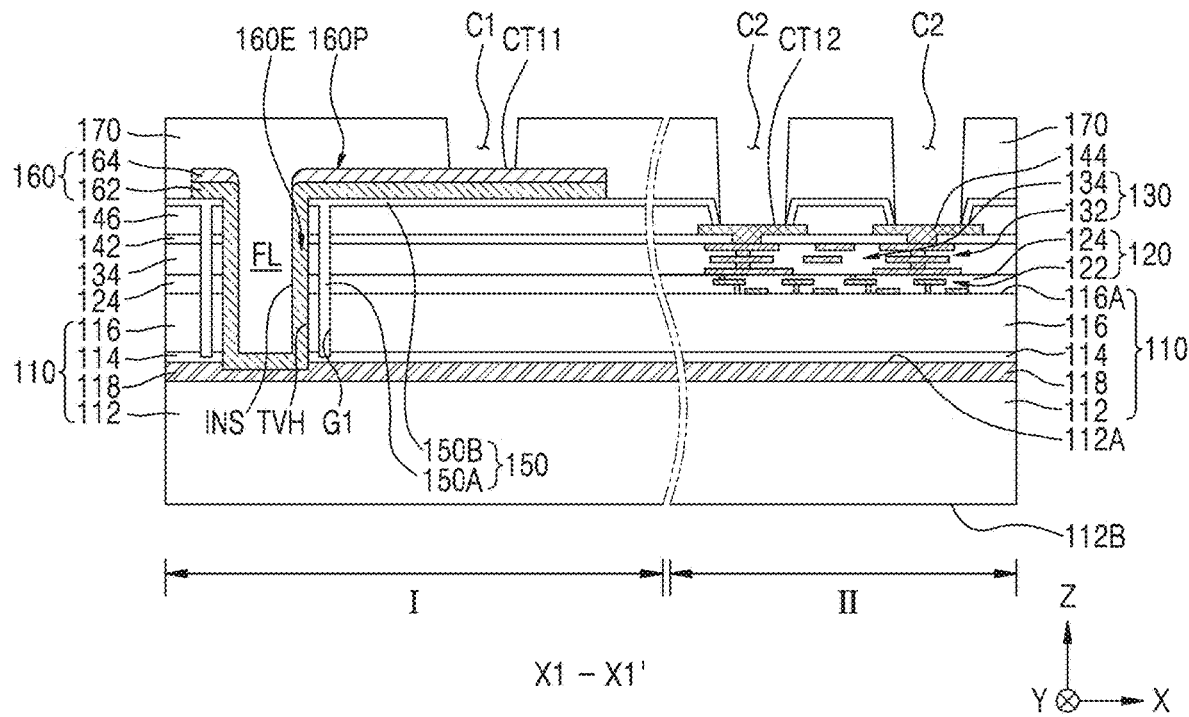

Referring to FIG. 13K, a portion of the third passivation film 170 may be removed in the electromagnetic shielding contact region I to form the first contact hole C1 exposing the contact region CT11 of the ground pad portion 160P, and portions of each of the third passivation film 170 and the insulating liner portion 150B may be removed in the integrated circuit device region II to form the second contact holes C2 exposing the contact regions CT12 of each of the plurality of contact pads 144.

Figure 13L:
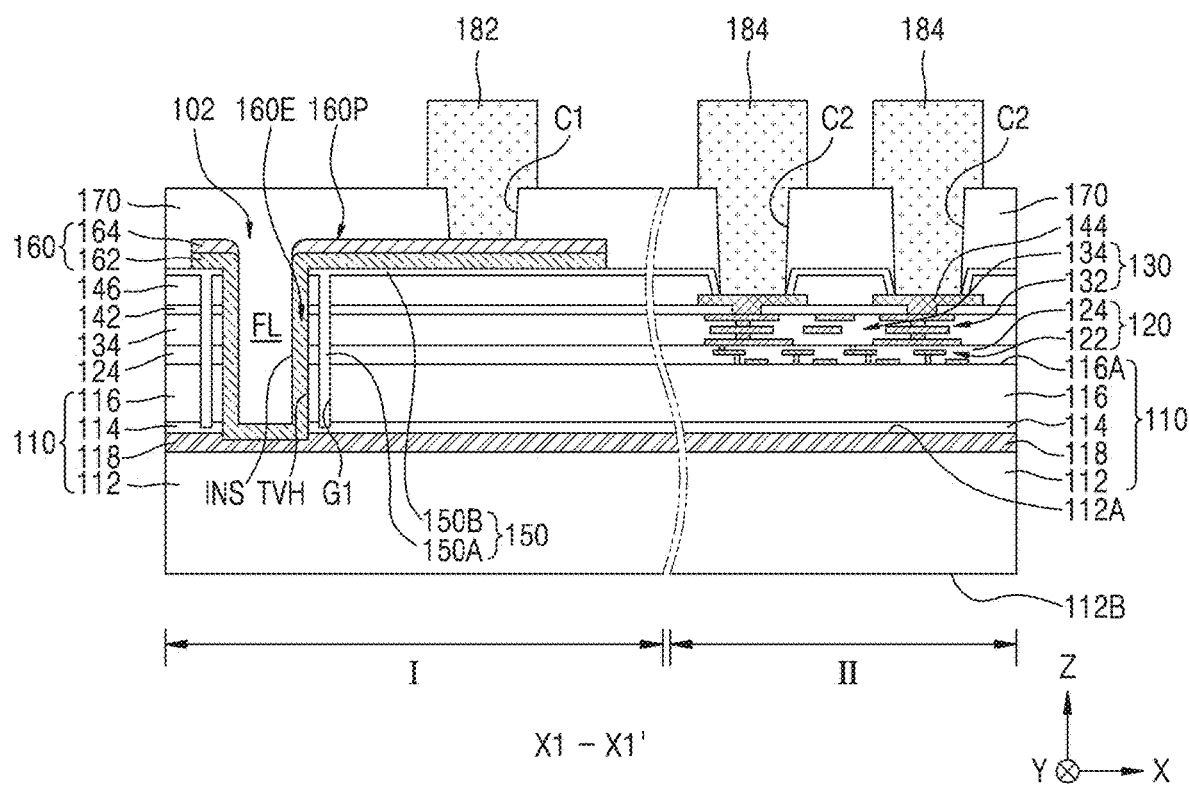

Referring to FIG. 13L, the first connection terminal 182 connected to the ground pad portion 160P through the first contact hole C1 in the electromagnetic shielding contact region I and the plurality of second connection terminals 184 connected to the plurality of contact pads 144 through the plurality of the second contact holes C2 in the integrated circuit device region II may be formed.

Figure 13M:
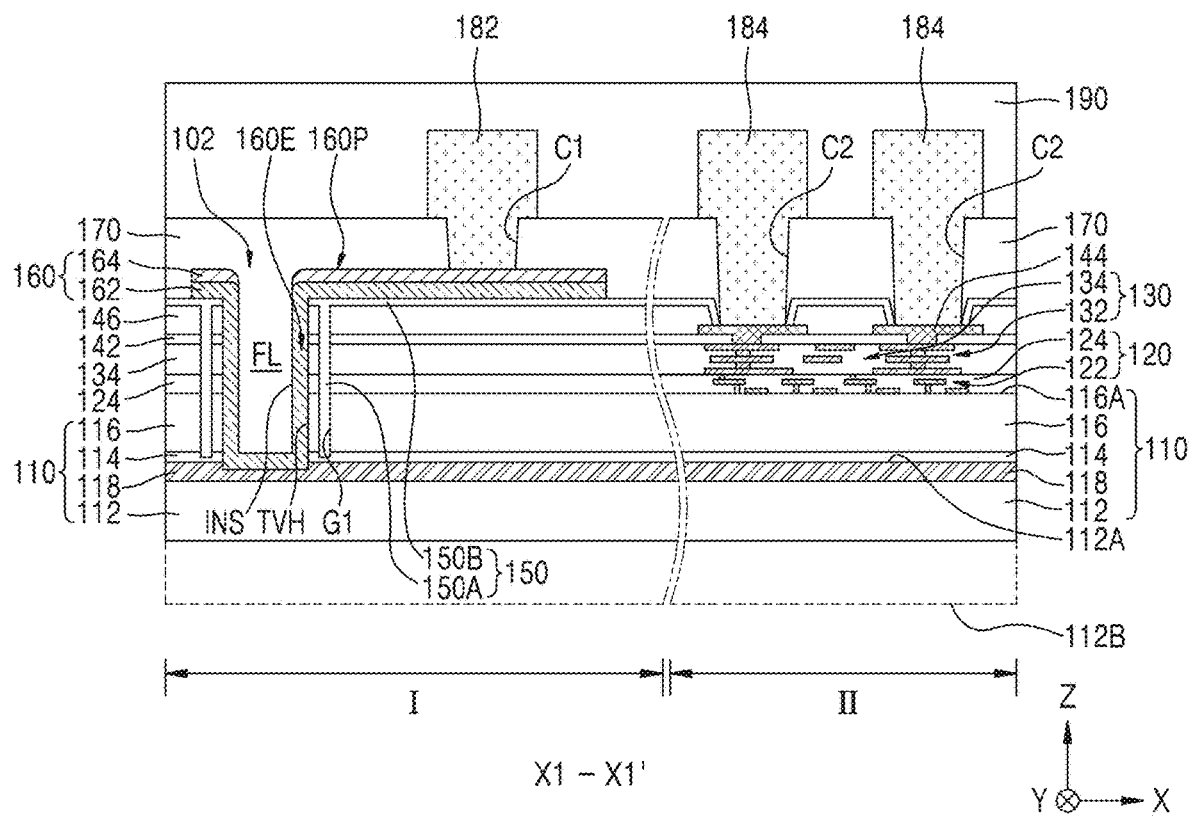

Referring to FIG. 13M, a thinning process of the bulk substrate 112 may be performed. For performing the thinning process, a portion of the thickness of the bulk substrate 112 may be removed from the second surface 112B of the bulk substrate 112 using an etching process, a polishing process, a grinding process, or a combination thereof. The first connection terminal 182 and the plurality of second connection terminals 184 on the SOI substrate 110 may be protected by a support body 190 while performing the thinning process of the bulk substrate 112. The support body 190 may include a substrate made of a hard material or a stretchable tape made of a soft material. The substrate made of the hard material may include glass, silicon, metal, or polymer. During performing the thinning process of the bulk substrate 112, the support body 190 may prevent the SOI substrate 110 from warping or being damaged and protect the FEOL structure 120 and the BEOL structure 130, the first connection terminal 182, the plurality of second connection terminals 184, and the like formed on the SW substrate 110. Thereafter, the support body 190 may be removed from the resultant of FIG. 13M to manufacture the integrated circuit chip 100 illustrated in FIGS. 1A and 1B.

The processes described with reference to FIGS. 13A to 13M may be used to manufacture the integrated circuit chip 200 illustrated in FIGS. 2A and 2B. However, in the process described with reference to FIG. 13I, when a portion of the conductive layer 160 is removed to form the penetrating electrode portion 160E and the ground pad portion 160P, the ground pad portion 160Q having a larger area than the ground pad portion 160P on the X-Y plane may be formed, instead of the ground pad portion 160P in the electromagnetic shielding contact region I. Thereafter, the third passivation film 170 may be formed by the method described with reference to FIG. 13J, and a portion of the third passivation film 170 may be removed by a method similar to that described with reference to FIG. 13K to form the plurality of first contact holes C1 exposing the ground pad portion 160Q. The plurality of first contact holes C1 may be arranged to be spaced apart from each other along the horizontal direction. Thereafter, the plurality of first connection terminals 182 may be formed to be connected to the ground pad portion 160Q through the plurality of first contact holes C1 by a method similar to that described with reference to FIG. 13L, and the thinning process of the bulk substrate 112 may be performed in the same manner as described with reference to FIG. 13M.

Figure 14A:
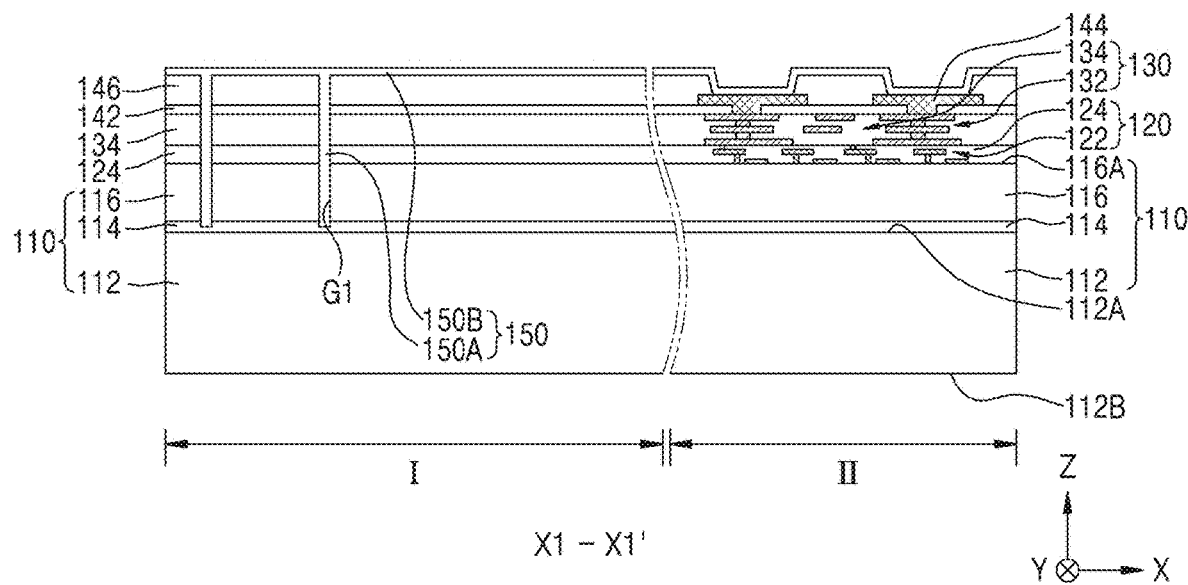
FIGS. 14A and 14B are cross-sectional views for explaining an example method of manufacturing an integrated circuit chip according to some embodiments of the inventive concepts.
Figure 14B:
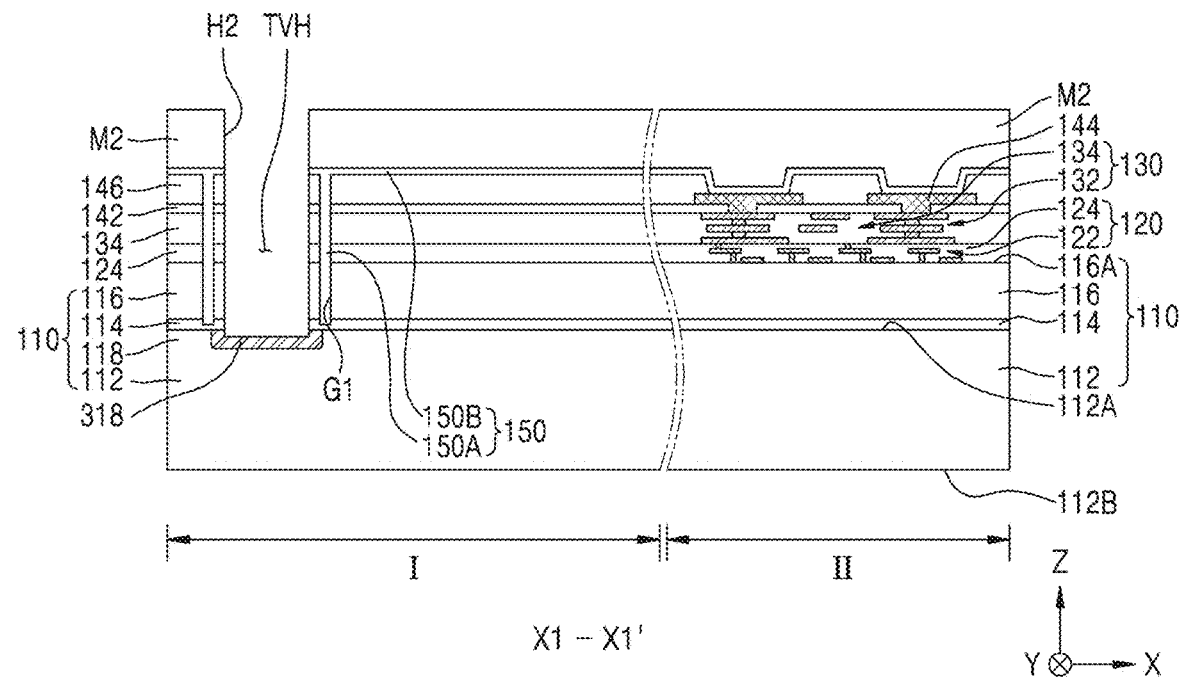

FIGS. 14A and 14B are cross-sectional views illustrating process steps for explaining an example manufacturing method of an integrated circuit chip according to some embodiments of the inventive concepts. An example manufacturing method of the integrated circuit chip 300 illustrated in FIG. 3 will be described with reference to FIGS. 14A and 14B.

Referring to FIG. 14A, the processes described with reference to FIGS. 13A to 13F may be performed. However, in this embodiment, the process of forming the conductive ion implantation region 118 in the bulk substrate 112 of the SOI substrate 110 is omitted.

Referring to FIG. 14B, the through via hole TVH may be formed in the resultant of FIG. 14A by a method as described with reference to FIG. 13G, and then dopant ions may be implanted into the bulk substrate 112 through the through via hole TVH, thereby forming the conductive ion implantation region 318 in the bulk substrate 112. Thereafter, the integrated circuit chip 300 illustrated in FIG. 3 may be manufactured by performing the processes described with reference to FIGS. 13H to 13M and form the resulting structure of FIG. 14B.

FIGS. 15A to 15H are cross-sectional views illustrating a method of manufacturing an integrated circuit chip according to some embodiments of the inventive concepts. An example manufacturing method of the integrated circuit chip 400 illustrated in FIGS. 4A and 4B will be described with reference to FIGS. 15A to 15H.

Figure 15A:
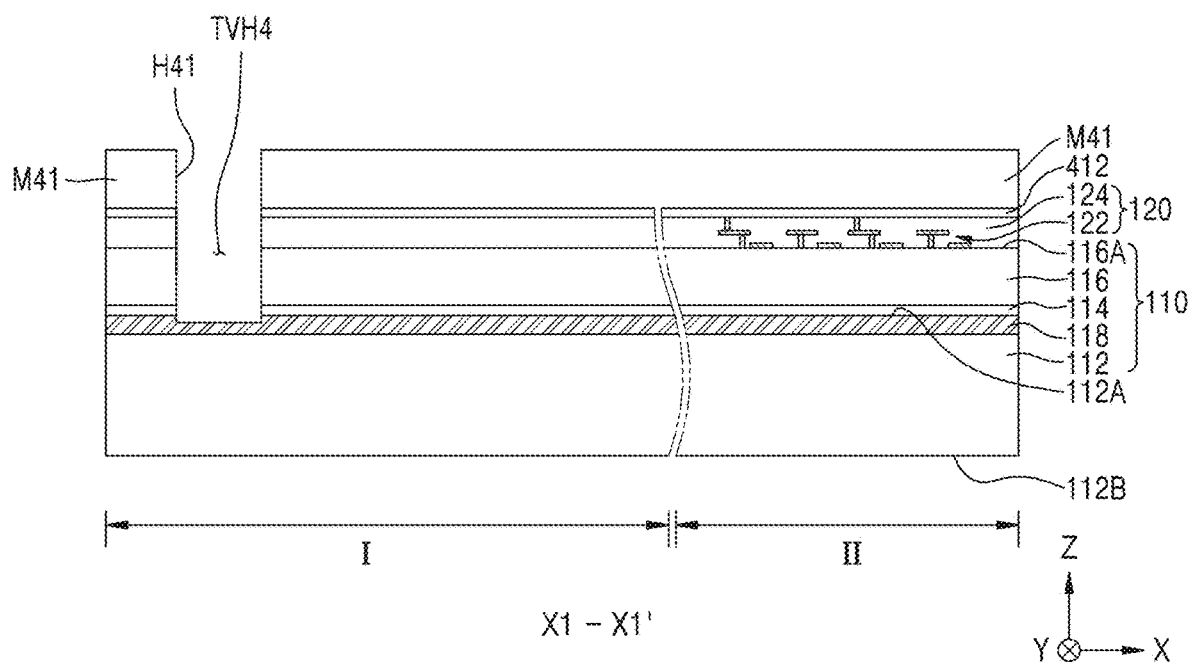
FIGS. 15A to 15H are cross-sectional views for explaining an example method of manufacturing an integrated circuit chip according to some embodiments of the inventive concepts.

Referring to FIG. 15A, the processes up to form the FEOL structure 120 on the SOI substrate 110 including the conductive ion implantation region 118 may be performed according to the same method as described with reference to FIGS. 13A and 13B. Thereafter, the polishing stopper film 412 and the mask pattern M41 having an opening H41 may be sequentially formed on the FEOL structure 120. The mask pattern M41 may include a photoresist pattern.

Thereafter, using the mask pattern M41 as an etching mask, the polishing stopper film 412 exposed through the opening H41. The underlying interlayer insulating film 124, the semiconductor body layer 116, and the buried insulating film 114 may be sequentially subjected to anisotropic etching to form a through via hole TVH4 having a bottom surface for exposing the conductive ion implanted region 118.

Figure 15B:
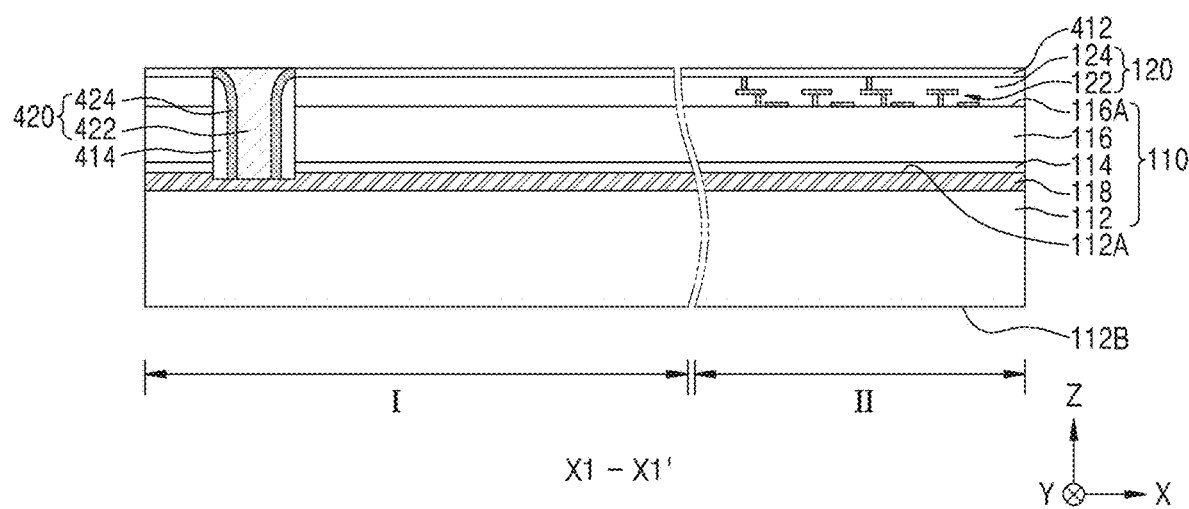

Referring to FIG. 15B, the mask pattern M41 may be removed from the resultant structure of FIG. 15A, and then the via insulating film 414 covering the sidewall of the through via hole TVH4 and the penetrating electrode portion 420, which fills the space defined by the via insulating film 414 in the through via hole TVH4, may be formed. The penetrating electrode portion 420 may include the metal plug 422 and the conductive barrier film 424 covering the surface of the metal plug 422. The bottom surface of the penetrating electrode portion 420 may be in contact with the conductive ion implantation region 118.

In the example process for forming the penetrating electrode portion 420, the conductive barrier film 424 may be formed to conformally cover the surface of the via insulating film 414 inside the through via hole TVH4 and the upper surface of the polishing stopper film 412; then a metal film for forming the metal plug 422 filling the through via hole TVH4 may be formed on the conductive barrier film 424; and then the conductive barrier film 424 and the metal film may be polished by a chemical mechanical polishing (CMP) process using the polishing stopper film 412 as a stopper so that the conductive barrier film 424 and the metal film remain only inside the through via hole TVH4.

Figure 15C:
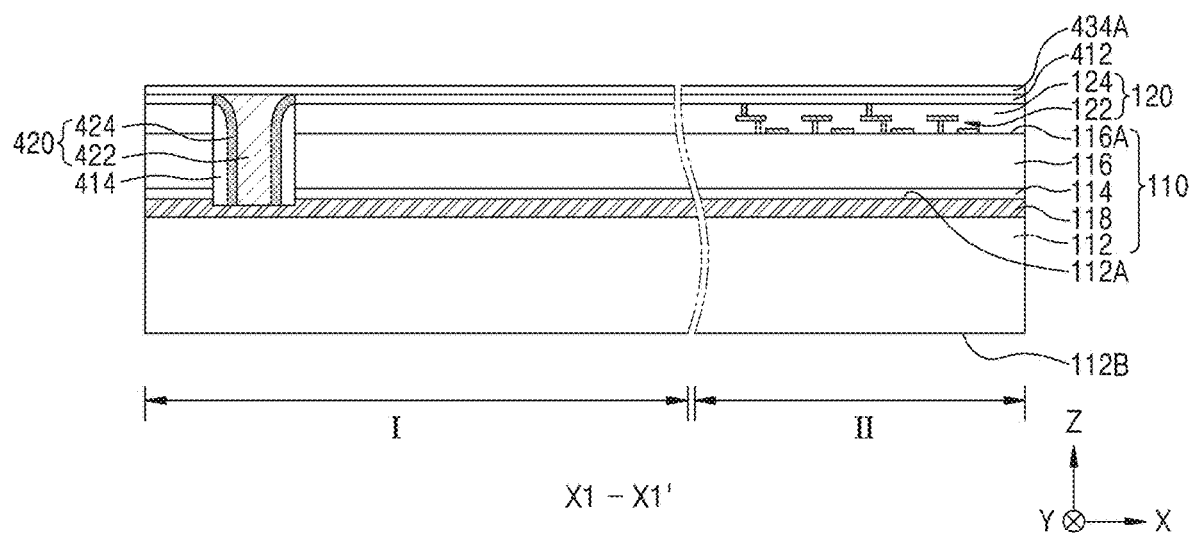

Referring to FIG. 15C, the first level insulating film 434A covering the penetrating electrode portion 420 and the polishing stopper film 412 in the electromagnetic shielding contact region I and the integrated circuit device region II may be formed.

Figure 15D:
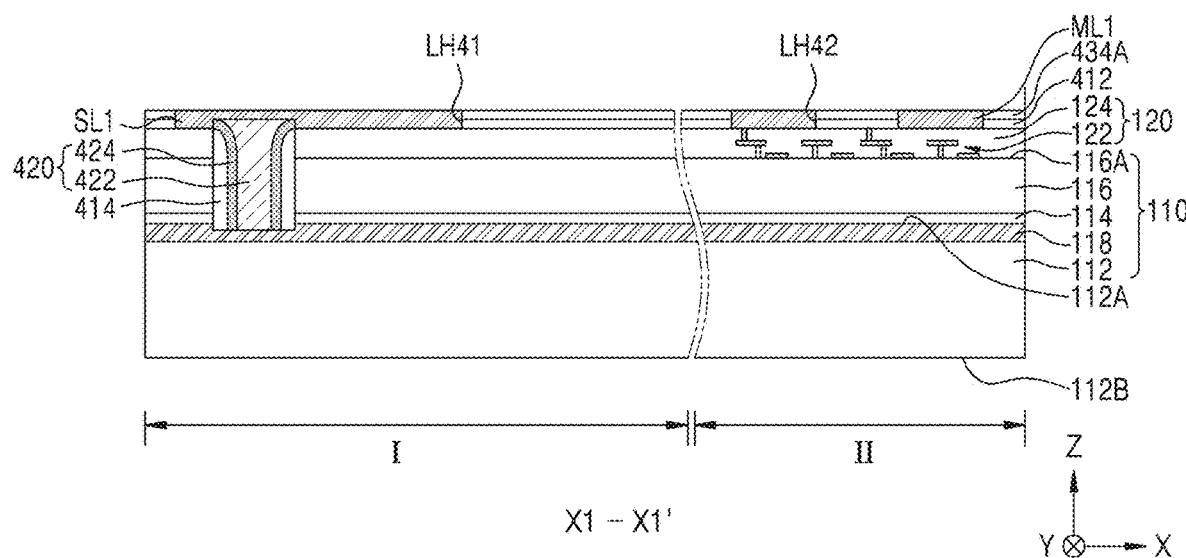

Referring to FIG. 15D, the first level insulating film 434A and the polishing stopper film 412 may be patterned in the electromagnetic shielding contact region I and the integrated circuit device region II, thereby forming a first interconnection hole LH41 for exposing the penetrating electrode portion 420 in the electromagnetic shielding contact region I and a plurality of second interconnection holes LH42 for exposing a conductive region included in the integrated circuit portion 122 of the FEOL structure 120 in the integrated circuit device region II. Thereafter, the first level shielding interconnection line SL1 filling the first interconnection hole LH41 and contacting with the penetrating electrode portion 420, and the plurality of first level interconnection lines ML1 filling the plurality of second interconnection holes LH42 and contacting with conductive regions of the integrated circuit portion 122 may be formed. Each of the constituent material of the first level shielding interconnection line SL1 and the plurality of the first level interconnection lines ML1 may be the same as those described for the constituent materials of the plurality of interconnection layers 132A constituting the plurality of multilayer interconnection structures 132 with reference to FIGS. 1A and 1B.

Figure 15E:
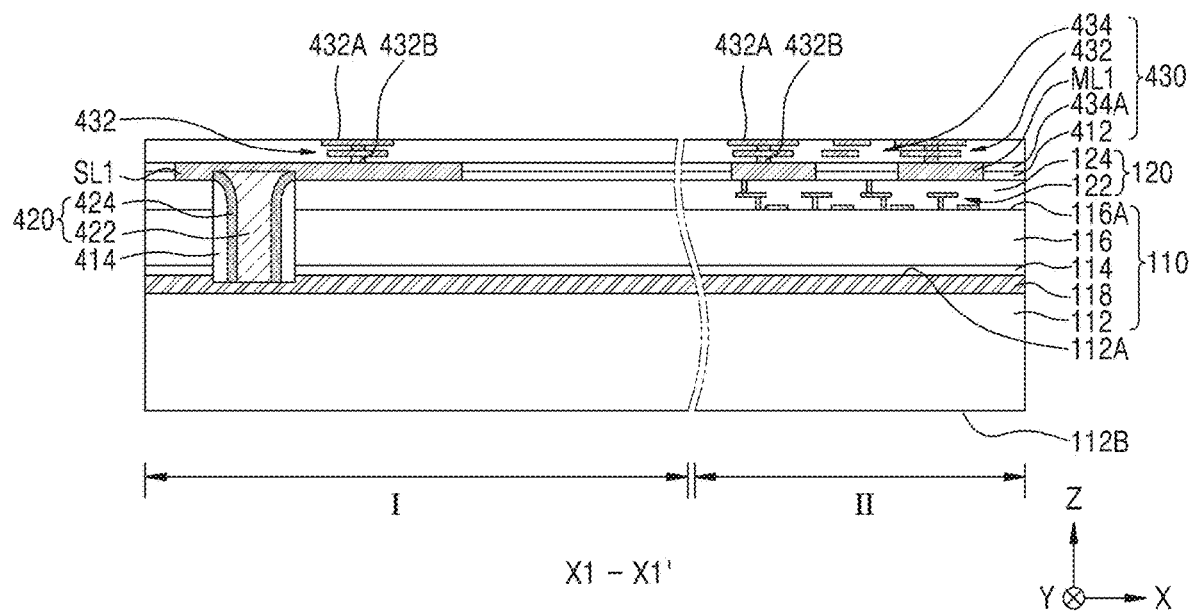

Referring to FIG. 15E, the plurality of multilayer interconnection structures 432 and the intermetal insulating film 434 for insulating from each other between the plurality of multilayer interconnection structures 432 may be formed on the resultant of FIG. 15D including the first level shielding interconnection line SL1 and the plurality of first level interconnection lines ML1. Each of the plurality of multilayer interconnection structures 432 may include the plurality of interconnection layers 432A and the plurality of contact plugs 432B interconnecting the plurality of interconnection layers 432A with each other. The polishing stopper film 412 and the first level insulating film 434A may be a portion of the intermetal insulating film 434. In the electromagnetic shielding contact region I and the integrated circuit device region II, the plurality of multilayer interconnection structures 432 and the intermetal insulating film 434 may constitute the BEOL structure 430.

Figure 15F:
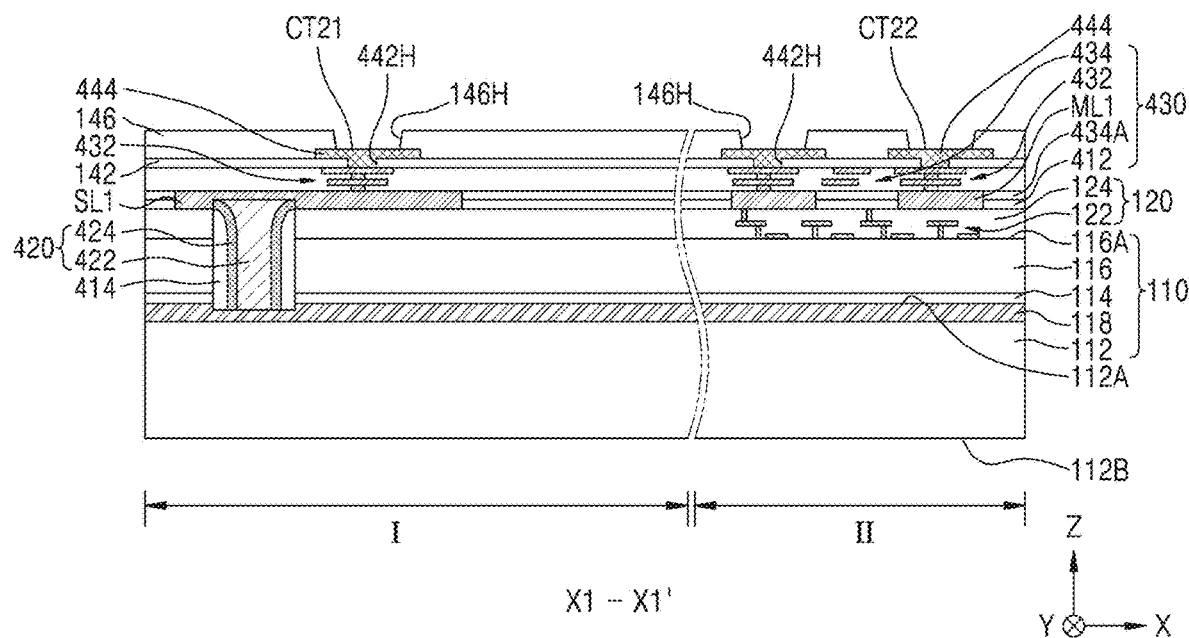

Referring to FIG. 15F, the first passivation film 142 may be formed to cover the BEOL structure 130 in a similar manner as described with reference to FIG. 13D, and then the plurality of contact pads 444 connected to the multilayer interconnection structure 132 may be formed in the electromagnetic shielding contact region I and the integrated circuit device region II. The plurality of contact pads 444 may be connected to the multilayer interconnection structure 432 through the plurality of contact holes 442H formed in the first passivation film 142.

Thereafter, the second passivation film 146 covering the plurality of contact pads 444 and the first passivation film 142 may be formed. A plurality of contact holes 146H may be formed in the second passivation film 146 to expose the contact regions CT21 and CT22 of the plurality of contact pads 444, respectively.

Figure 15G:
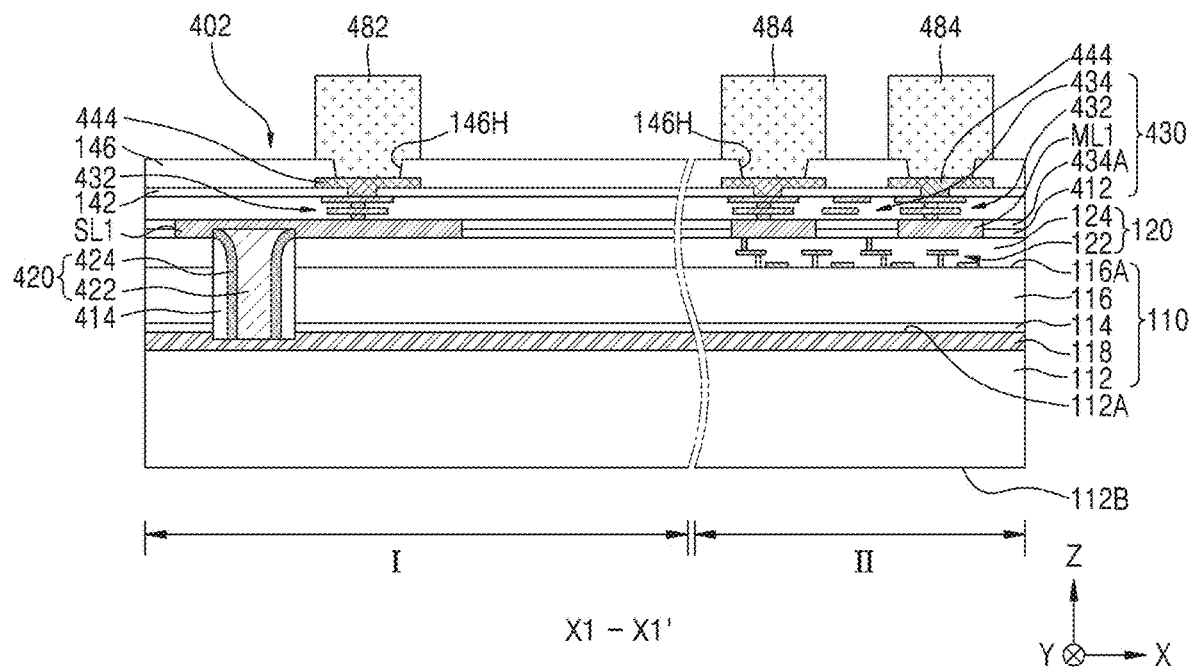

Referring to FIG. 15G, in a manner similar to that described with reference to FIG. 13I, the first connection terminal 482 connected to the contact pad 444 through the contact hole 146H in the electromagnetic shielding contact region I and the plurality of the second connection terminals 484 connected to the plurality of contact pads 444 through the contact hole 146H in the integrated circuit device region II may be formed.

Figure 15H:
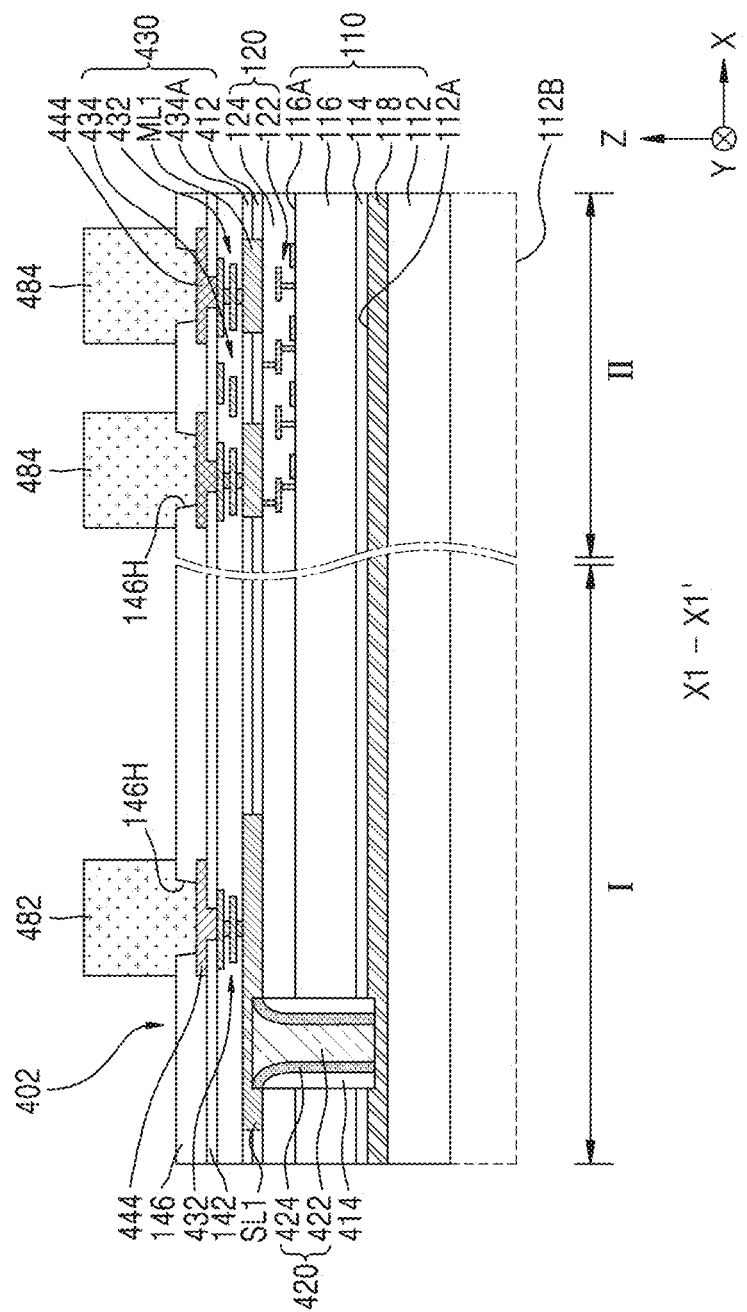

Referring to FIG. 15H, a thinning process of the bulk substrate 112 may be performed in a manner similar to that described with reference to FIG. 13M, thereby reducing the thickness of the bulk substrate 112 to form the integrated circuit chip 400 illustrated in FIGS. 4A and 4B.

The processes described with reference to FIGS. 15A to 15H may be used to manufacture the integrated circuit chip 500 illustrated in FIG. 5. However, the process of forming the conductive ion implantation region 118 in the bulk substrate 112 of the SOI substrate 110 in the process described with reference to FIG. 15A may be omitted. After the through via hole TVH4 may be formed, the dopant ions may be implanted into the bulk substrate 112 through the through via hole TVH4 in a manner similar to that described with reference to FIG. 14B to form the conductive ion implantation region 518. Thereafter, the integrated circuit chip 500 illustrated in FIG. 5 may be manufactured by performing the processes described with reference to FIGS. 15B to 15H.

While the inventive concepts have been particularly shown and described with reference to embodiments thereof, it will be understood that various changes in form and details may be made therein without departing from the spirit and scope of the following claims.

What is claimed is:

1. An integrated circuit chip comprising:
a semiconductor on insulator (SOI) substrate having a structure in which a bulk substrate, a buried insulating film, and a semiconductor body layer are sequentially stacked;
a conductive ion implantation region formed at a position adjacent to the buried insulating film in the bulk substrate;
an integrated circuit portion formed on an active surface of the semiconductor body layer;
a penetrating electrode portion arranged at a position spaced apart from the integrated circuit portion in a horizontal direction, the penetrating electrode portion penetrating the semiconductor body layer and the buried insulating film in a vertical direction, the penetrating electrode portion connected to the conductive ion implantation region, and the penetrating electrode portion having a U-shaped cross sectional shape;
a plurality of interconnection structures arranged on the integrated circuit portion and connected to the integrated circuit portion;
an intermetal insulating film for mutually insulating the plurality of interconnection structures from each other, wherein the penetrating electrode portion penetrates the intermetal insulating film;
a plurality of passivation films covering the plurality of interconnection structures;

a ground pad portion extending in a horizontal direction over an upper surface of the plurality of passivation films and integrally connected to the penetrating electrode portion;
a first connection terminal formed over the plurality of passivation films and connected to the ground pad portion;
at least one contact pad connected to at least one interconnection structure of the plurality of interconnection structures through one passivation film selected from the plurality of passivation films; and
at least one second connection terminal formed over the plurality of passivation films and connected to the at least one contact pad,
wherein a vertical distance from the semiconductor body layer to the ground pad portion is greater than a vertical distance from the semiconductor body layer to the at least one contact pad, and
wherein a vertical length of the first connection terminal is less than a vertical length of the at least one second connection terminal.

2. The integrated circuit chip of claim 1, wherein the at least one connection terminal comprises a plurality of connection terminals connected to the ground pad portion.

3. The integrated circuit chip of claim 1, wherein the conductive ion implantation region is formed entirely on a surface of the bulk substrate.

4. The integrated circuit chip of claim 1, wherein the conductive ion implantation region is formed locally around the penetrating electrode portion in a region of the bulk substrate that does not vertically overlap the integrated circuit portion.

5. The integrated circuit chip of claim 1, further comprising:
a penetrating insulating portion surrounding at least a portion of the penetrating electrode portion at a position spaced apart from the penetrating electrode portion in the horizontal direction and extending in the vertical direction through the semiconductor body layer and the buried insulating film.

6. The integrated circuit chip of claim 1, further comprising:
a via insulating film which contacts an outer sidewall of the penetrating electrode portion and at least vertically surrounds the penetrating electrode portion.

7. An integrated circuit chip comprising:
a semiconductor on insulator (SOI) substrate comprising a semiconductor body layer having an active surface, a buried insulating film contacting with an opposite surface of the active surface of the semiconductor body layer, and a bulk substrate facing the semiconductor body layer with the buried insulating film therebetween;
a conductive ion implantation region formed in the bulk substrate at a position adjacent to the buried insulating film;
a front-end-of-line (FEOL) structure including an integrated circuit portion formed on the active surface of the semiconductor body layer;
a penetrating electrode portion penetrating the FEOL structure, the semiconductor body layer, and the buried insulating film in a vertical direction, the penetrating electrode portion having a first end contacting with the conductive ion implantation region, and the penetrating electrode portion having a U-shaped cross sectional shape;
a back-end-of-line (BEOL) structure formed on the FEOL structure and comprising a plurality of interconnection structures connected to the integrated circuit portion, wherein the penetrating electrode portion comprises a portion penetrating the BEOL structure in the vertical direction;
a plurality of passivation films covering the BEOL structure;
a ground pad portion extending in a horizontal direction over an upper surface of the plurality of passivation films and integrally connected to the penetrating electrode portion;
a first connection terminal formed over the plurality of passivation films and connected to the ground pad portion;
at least one contact ad connected to at least one interconnection structure of the plurality of interconnection structures in the BEOL structure through one passivation film selected from the plurality of passivation films; and
at least one second connection terminal formed over the plurality of passivation films and connected to the at least one contact pad,
wherein a vertical distance from the semiconductor body layer to the ground pad portion is greater than a vertical distance from the semiconductor body layer to the at least one contact pad, and
wherein a vertical length of the first connection terminal is less than a vertical length of the at least one second connection terminal.

8. The integrated circuit chip of claim 7, wherein the BEOL further comprises:
a first multilayer interconnection structure connected to the penetrating electrode portion and a second multilayer interconnection structure connected to the integrated circuit portion, wherein the first multilayer interconnection structure comprises a shielding interconnection contacting with the penetrating electrode portion.

9. The integrated circuit chip of claim 8,
wherein the shielding interconnection is an interconnection layer closest to the FEOL structure among multiple levels of interconnection layers in the first multilayer interconnection structure.

10. The integrated circuit chip of claim 7,
wherein the conductive ion implantation region is formed entirely on a surface of the bulk substrate contacting with the buried insulating film.

11. The integrated circuit chip of claim 7,
wherein the penetrating electrode portion includes an island-shaped planar structure, and
wherein the conductive ion implantation region is formed locally around the penetrating electrode portion in a region of the bulk substrate that does not vertically overlap the integrated circuit portion.

12. The integrated circuit chip of claim 7,
wherein the penetrating electrode portion includes a ring-shaped planar structure extending along an edge portion of the integrated circuit chip so as to surround the integrated circuit portion.

* * * * *